(12) United States Patent
Nojima et al.

(10) Patent No.: US 6,399,277 B1
(45) Date of Patent: Jun. 4, 2002

(54) PHOTOPOLYMERIZABLE THERMOSETTING RESIN COMPOSITION

(75) Inventors: Yasuharu Nojima, Osaka; Toyoyuki Ido, Takarazuka, both of (JP)

(73) Assignee: Vantico Inc., Brewster, NY (US)

( * ) Notice: Subject to any disclaimer, the term of this patent is extended or adjusted under 35 U.S.C. 154(b) by 0 days.

(21) Appl. No.: 09/214,053

(22) PCT Filed: Jun. 17, 1997

(86) PCT No.: PCT/EP97/03141

§ 371 (c)(1),
(2), (4) Date: Dec. 28, 1998

(87) PCT Pub. No.: WO98/00759

PCT Pub. Date: Jan. 8, 1998

(30) Foreign Application Priority Data

Jun. 28, 1996 (JP) .............................. 8-169236

(51) Int. Cl.$^7$ ............................. G03F 7/027; G03F 7/32
(52) U.S. Cl. ..................... 430/280.1; 430/311; 430/331
(58) Field of Search ................................ 430/280.1, 92; 522/92, 101

(56) References Cited

U.S. PATENT DOCUMENTS

| | | | |
|---|---|---|---|
| 3,980,483 A | 9/1976 | Nishikubo et al. | ............ 96/115 |
| 4,499,163 A | 2/1985 | Ishimaru et al. | ................ 430/5 |
| 4,925,773 A | * 5/1990 | Miyamura et al. | ........ 430/285.1 |
| 4,943,516 A | 7/1990 | Kamayachi et al. | ..... 430/280.1 |
| 5,009,982 A | 4/1991 | Kamayachi et al. | ..... 430/280.1 |
| 5,882,843 A | * 3/1999 | Kudo et al. | .............. 430/285.1 |

FOREIGN PATENT DOCUMENTS

| | | |
|---|---|---|
| CA | 1151789 | 8/1983 |
| EP | 0733683 | 9/1996 |
| EP | 0758097 A1 | 2/1997 |
| JP | 8-41150 | 5/1997 |

OTHER PUBLICATIONS

Derwent Abstr. 92–205233 for JP 4136020.
Derwent Abstr. 94–203089 for JP 6138659.
Derwent Abstr. 92–369438 for JP 4270345.
Derwent Abstr. 08025X/05 for JP 50006408, Jan., 1, 1975.
Derwent Abstr. 25742V/14 for JP 49005923, Jan., 1974.
Derwent Abstr. 95–050473 for JP 07050473, Feb., 1995.

* cited by examiner

*Primary Examiner*—Cynthia Hamilton
(74) *Attorney, Agent, or Firm*—Lyon & Lyon LLP

(57) ABSTRACT

A photopolymeriziable thermosetting resin composition comprising (A) a mixture consisting of (a) an active energy ray-setting resin and obtained by reacting an unsaturated monobasic acid copolymer resin with a cycloaliphatic epoxy group-containing unsaturated compound or reacting a cycloaliphatic epoxy group containing copolymer resin with an acid group-containing unsaturated compound and (b) an photosensitive prepolymer obtained by esterifying a novolak type epoxy compound with an alpha-beta-unsaturated carboxylic acid and then further reacting with polybasic acid anhydride (and in one embodiment further reacting with an unsaturated isocyanate).

14 Claims, No Drawings

PHOTOPOLYMERIZABLE THERMOSETTING RESIN COMPOSITION

This invention relates to a photosensitive thermosetting resin composition, more specifically to a novel photosensitive thermosetting resin composition which is useful as a solder resist for a printed wiring board, and a process for forming a solder resist pattern by coating the photosensitive thermosetting resin composition, carrying out drying by a dryer at a constant temperature, exposing the composition selectively through a film on which a predetermined pattern is formed, with active rays, developing an unexposed portion and further carrying out heating.

The present invention relates to a photosensitive thermosetting resin composition which is suitable as a solder resist having excellent adhesion property, water-soluble flux resistance, water resistance, moisture resistance, electric characteristics, photosensitivity, resolution property, soldering resistance, chemical resistance, solvent resistance and whitening resistance and also has adhesion property on a rust preventive used for protecting the circuit of a printed wiring board.

According to the present invention, it becomes possible to cope with attachment of gas to surrounding apparatuses caused by gas generation which is a problem when a printed wiring board is produced, and environmental problems, etc. caused by gas generation.

In general, a printed wiring board has been used frequently for incorporating electronic parts compactly. The printed wiring board is obtained by etching a copper foil clad on a laminate along a circuit wiring, and electronic parts are arranged at predetermined places and soldered. A solder resist is used in a step prior to soldering of electronic parts to such a printed wiring board, and a film is formed on the entire surface of a circuit conductor except portions on which electronic parts are to be soldered. Such a film not only functions as an insulating film which prevents soldering from being attached to unnecessary portions when soldering is carried out, but also functions as a protective film which prevents corrosion caused by oxidation and moisture when a circuit conductor is exposed directly to air, so that the film is indispensable. In the prior art, such solder resists have been formed by screen printing them on substrates and setting them by UV rays or heat. These solder resists for industrial use have been disclosed in, for example, Japanese Patent Publication No. 14044/1976.

As a material for public welfare obtained by paying attention to productivity, a rapid-setting UV ray-setting type material as disclosed in, for example, Japanese Patent Publication No. 48800/1986 has been used mainly. However, for the purpose of realizing high density, a printed substrate has tended to be made finer and larger in quantity and made into one board, its level has been heightened at remarkable speed, and a mounting system has been shifted to surface mounting technology (SMT). Accompanied with a finer printed substrate and SMT, also in a solder resist, demands for high resolution property, high precision and high reliability have been increased, and there have been proposed from a screen printing method to a liquid photoresist method which is excellent in positional precision and coating property of a conductor edge portion, for both of a substrate for public welfare and a substrate for industrial use.

For example, in Japanese Unexamined Patent Publication No. 55914/1982, there have been disclosed dry film type photo-sensitive solder resists which comprise urethane di(meth)acrylate, a specific linear high molecular weight compound and a sensitizer. When these dry film type photo-sensitive solder resists are used for a high density printed wiring board, soldering resistance and adhesion property are not sufficient.

As an active energy ray-setting material which can be developed with alkali, there have been disclosed materials using, as a base polymer, a reaction product obtained by reacting an epoxy resin with an unsaturated monocarboxylic acid and further adding a polybasic acid anhydride thereto in Japanese Patent Publication No. 40329/1981 and Japanese Patent Publication No. 45785/1982. In Japanese Unexamined Patent Publication No. 243869/1986, there has been disclosed a liquid solder resist composition which uses a novolak type epoxy resin, has good heat resistance and chemical resistance and can be developed with a dilute alkaline aqueous solution. However, in the above solder resist composition, depending on a combination of a polybasic acid anhydride, an epoxy resin and an epoxy resin-setting agent to be reacted to make the composition soluble in an alkaline developing solution, thermosetting proceeds at the time of drying after coating a resist, whereby development failure occurs, or electrolytic corrosion and discoloration of a copper foil surface are caused. Further, there are limitations that electric characteristics are bad due to influence by a carboxylic acid generated by reacting a polybasic acid anhydride, heat resistance and adhesion property are poor when the amount of an epoxy resin which is a thermosetting component used for obtaining characteristics as a solder resist is small, and it is difficult to carry out development with a dilute alkaline aqueous solution when the above amount is large. Moreover, the above solder resist composition has problems that setting by UV rays is slow to require a long exposure time, and sufficient soldering resistance has not yet been obtained.

In order to solve these problems, in Japanese Unexamined Patent Publication No. 50473/1995 and Japanese Patent Publication No. 17737/1995, there have been disclosed solder resist compositions comprising a novolak type epoxy resin, particularly a cresol novolak epoxy resin-esterified acid adduct, a sensitizer, an epoxy compound, an epoxy-setting agent, etc. However, these solder resists have poor photosensitivity, so that for the purpose of improving photosensitivity, the amount of a polymerizable vinyl monomer is increased, or the amount of a photopolymerization initiator is increased. In the former case, tackiness is worsened, so that sticking of a film and attachment of a resist occur to cause peeling. In the latter case, although photosensitivity is improved by increasing the amount of a photopolymerization initiator to be added, there is a problem that an unreacted substance is sublimated at the time of exposure or postcure to foul a substrate or pollute environment. For the purpose of protecting the environment of the earth, a method in which various kinds of parts are soldered on a printed wiring board and then washed has come into question. From the point of protecting environment, a flux to be used for solving these problems is subjected to washing with water in place of washing with a solvent, and water-soluble fluxes and non-washing type fluxes have been used. Many of these fluxes are strongly active and have caused a problem in soldering resistance of a solder resist, so that improvement of resistance of the resist has been demanded. Further, surface mounting is used in a soldering method, and electroless gold plating is carried out or rust preventive treatment is carried out for the purpose of preventing oxidation of a printed wiring board. There is a problem of peeling of a resist, caused by these treatments carried out before coating a resist or after forming a resist. Further, since a printed wiring board has high density, the surface treatment method of a substrate has been shifted gradually from mechanical polishing to chemical polishing, so that a demand for adhesion property on rust preventive treatment has been increased. With respect to characteristics of a resist, due to a demand for high density of a printed substrate, there have been higher demands for resolution property, electric characteristics, etc. Existing solder resists which comprise a cresol novolak type epoxy-modified resin as a main component are not sufficient and also have a problem in reliability.

With the aim of solving the problem mentioned above, Japanese Patent Kokai Hei 8-41150 has disclosed a solder resist composition comprising an unsaturated group-containing resin, a sensitizer, a monomer, a polymerizable prepolymer, an epoxy resin and an epoxy curing agent. However, this type of solder resist gives a hard coating film after cure and is inferior in adhesiveness. In the gazette mentioned above, a flexible resin such as polyester polyol acrylate or polyether polyol acrylate is added in order to improve the adhesiveness. However, these materials are hygroscopic and make troubles such as decrease in developability and appearance of tackiness, so that the good characteristic properties which the unsaturated group-containing resin originally has, such as water resistance, photosensitivity and heat resistance, are deteriorated by their addition. Further, adhesiveness decreases after boiling in water or after thermal hysteresis, so that mechanical processability is not good. Further, the composition has a problem concerning stability of quality when made into an ink. Thus, although no problem arises in the initial stage of use, these compositions exhibit a gradual decrease of developability when standing after preliminary drying or show a phenomenon of gelation due to reactivity after being made into an ink, so that these compositions cannot be said to be satisfactory as a solder resist.

In order to solve these problems, the present inventors have studied intensively for obtaining an excellent solder resist composition to accomplish the present invention.

It is an object of the present invention to provide a photosensitive thermosetting resin composition which does not have various problems as described above and is excellent in operating properties and various characteristics. The present invention is to provide a photosensitive resin composition which is useful as a liquid photoresist and can be developed with a dilute and weakly alkaline aqueous solution, in which with respect to operating properties, coating property, drying property, tackiness, photosetting property, developability, thermosetting property, a pot life, a shelf life, etc. are excellent and a printed wiring board can be formed in a short time, and with respect to characteristics, soldering resistance, solvent resistance, chemical resistance, adhesion property, electric insulating property, electrolytic corrosion resistance, electric characteristics under humidification, plating resistance, adhesion property on a substrate subjected to rust preventive treatment, etc. are excellent, all of which are required for a solder resist.

The object of the present invention consists in solving the above-mentioned problems. The present inventors have found that all the problems mentioned above can be solved by using a photopolymerizable thermosetting resin composition which is a compounded mixture of an active energy ray-setting resin (a) and a photosensitive prepolymer (b) having an acid value of 40–160 mg KOH/g, wherein said ingredient (a) is (i) an unsaturated resin (a-1) obtained by reacting an unsaturated monobasic acid copolymer resin with a cycloaliphatic epoxy group-containing unsaturated compound or (ii) an unsaturated resin (a-2) obtained by reacting a cycloaliphatic epoxy group-containing copolymer resin with an acid group-containing unsaturated compound, and said ingredient (b) is selected from the group consisting of (i) a prepolymer (b-1) obtained by esterifying a novolak type epoxy compound with an α,β-unsaturated carboxylic acid to form a total epoxy groups-esterified product, followed by reacting the total epoxy groups-esterified product thus obtained with a saturated or unsaturated polybasic acid anhydride, (ii) a prepolymer (b-2) obtained by esterifying a novolak type epoxy compound with an (α,β-unsaturated carboxylic acid to form a partial epoxy groups-esterified product, followed by reacting the partial epoxy groups-esterified product thus obtained with a saturated or unsaturated polybasic acid anhydride, and (iii) a prepolymer (b-3) obtained by reacting a diisocyanate with a (meth)acrylate having one hydroxyl group in one molecule to form a reaction product, followed by reacting the reaction product thus obtained with the secondary hydroxyl groups of the above-mentioned total epoxy groups-esterified product to form a reaction product, and then reacting the reaction product thus obtained with a saturated or unsaturated polybasic acid anhydride; and the ingredients (a) and (b) are compounded together at a compounding ratio of 5–100 parts by weight of (b) per 100 parts by weight of (a). Based on this finding, the present invention has been accomplished.

Thus, the photopolymerizable thermosetting resin composition of the present comprises (A) a mixture of an active energy ray-setting resin (a) and a photosensitive prepolymer (b) having an acid value of 40–160 mg KOH/g, (B) a diluent, (C) a photopolymerization initiator, (D) a setting adhesion-imparting agent and (E) an epoxy group-containing compound, wherein said active energy ray-setting resin (a) is selected from the group consisting of (i) an unsaturated resin (a-1) obtained by reacting an unsaturated monobasic acid copolymer resin with a cycloaliphatic epoxy group-containing unsaturated compound and (ii) an unsaturated resin (a-2) obtained by reacting a cycloaliphatic epoxy group-containing copolymer resin with an acid group-containing unsaturated compound; said photosensitive prepolymer (b) is selected from the group consisting of (i) a prepolymer (b-1) obtained by esterifying a novolak type epoxy compound with an α,β-unsaturated carboxylic acid to form a total epoxy groups-esterified product, followed by reacting the total epoxy groups-esterified product thus obtained with a saturated or unsaturated polybasic acid anhydride, (ii) a prepolymer (b-2) obtained by esterifying a novolak type epoxy compound with an α,β-unsaturated carboxylic acid to form a partial epoxy groups-esterified product, followed by reacting the partial epoxy groups-esterified product thus obtained with a saturated or unsaturated polybasic acid anhydride, and (iii) a prepolymer (b-3) obtained by reacting a diisocyanate with a (meth)acrylate having one hydroxyl group in one molecule to obtain a reaction product, followed by reacting the reaction product thus obtained with the secondary hydroxy groups of the above-mentioned total epoxy groups-esterified product to obtain a reaction product, and then reacting the reaction product thus obtained with a saturated or unsaturated polybasic acid anhydride; and the ingredients (a) and (b) are compounded at a compounding ratio of 5–100 parts by weight of (b) per 100 parts by weight of (a).

The preferred formulation ratio of the respective components is 30 to 70, in particular 40 to 60 parts by weight of (A), 5 to 50 parts by weight of (B), 0.5 to 20, in particular 3 to 10, parts by weight of (C), 0.01 to 10, in particular 0.1 to 7, parts by weight of (D) and 5 to 50, in particular 10 to 30, parts by weight of (E).

The present invention also relates to the above photopolymerizable thermosetting resin compositions which are used as a solder resist.

Further, the present invention also relates to a process for forming a solder resist pattern, which comprises coating a printed circuit board with the above photopolymerizable thermosetting resin composition, preliminarily drying the coated printed circuit board, selectively exposing the coated printed circuit board through a photomask to an active energy ray to effect photopolymerization, developing the unexposed area with a developing liquid to form a resist pattern and then thermosetting the resist pattern by heating.

The coating film of the photosensitive thermosetting resin composition can be formed by any method, for example, coating the composition on the entire surface of a printed wiring board on which a circuit is formed, by a method using screen printing, a curtain coater, a roll coater or a spray coater, or forming the above composition into a dry film and laminating the dry film directly on a printed wiring board, or coating the composition in a liquid state by the above method and laminating a dry film thereon in a wet state or a dry state. Thereafter, the coating film is exposed by direct irradiation of laser rays or selectively through a photomask on which a predetermined pattern is formed, with active rays of a high pressure mercury lamp, an ultra-high pressure mercury lamp, a metal halide lamp, a chemical lamp, a xenon lamp or the like, and an unexposed portion is developed with a developing solution to form a resist pattern. Thereafter, the above epoxy compound is thermoset by heating to form a solder resist pattern.

In the case of a photosensitive thermosetting resin composition for a solder resist, in which a photosensitive prepolymer (a novolak type epoxy resin) is used in combination of an epoxy resin as a thermosetting component, there has been generally used an epoxy resin which is soluble in an organic solvent. When a photosensitive thermosetting resin composition is prepared by using such an epoxy resin, it is estimated that the epoxy resin is melted in a state that the epoxy resin is entangled with a photosensitive prepolymer (a state that chain length portions of the respective resins are entangled with each other). As a result, optical functional groups are settled in a skeleton, so that photosensitivity is poor, and time is required for exposure. Further, if a coating film becomes thick, the photosensitivity at the inner portion of the coating film is lowered to enlarge an undercut, whereby resolution property is poor. In order to improve the photosensitivity of this type, the amount of a photopolymerization initiator should be increased, or the amount of a photosetting vinyl monomer should be increased. Due to presence of the epoxy resin, the crosslinking density of the photosensitive prepolymer is not increased, and yet the photosensitive prepolymer is dissolved in a developing solution, so that there are problems that the coating film is eroded easily, and sensitivity is worsened. Therefore, when soldering is carried out by a water-soluble flux or the like, a white film-like substance is generated on the coating film to cause appearance failure. Particularly, a modified type of novolak type epoxy resin is not provided with resistance to flux, although K-183 (produced by Alpha-Metal Co.) has flux resistance. However, when operating properties are ignored and a vinyl monomer is used in a large amount, resistance is obtained, but tackiness on operation becomes strong to cause a problem that contact exposure cannot be carried out. There is a means of increasing the amount of a photopolymerization initiator, a sensitizer or the like, but an unreacted substance remains in the inner portion of a solder resist set film to cause a large number of problems that gas is generated at the time of setting, a plating bath is fouled, etc. Further, in order to carry out development with an alkaline aqueous solution, when a solder resist is prepared by using a novolak type epoxy-modified resin, particularly a cresol novolak type epoxy resin as a base due to influence of a carboxyl group, an ester group or the like, electric characteristics are worsened by absorption of water generated when development with an alkaline aqueous solution is carried out, due to water resistance of the novolak type epoxy resin. Particularly in a printed substrate used for vehicles, insulation resistance during humidification is measured, which cannot be satisfied by any printed substrate. The water absorption property of the set coating film is different, so that water resistance is bad. By these actions, an alkali development type solder resist has poor electric characteristics at the time of humidification.

Compared with the above, in an energy ray-setting resin of the present invention, particularly addition reaction of cycloaliphatic epoxy groups derived from an cycloaliphatic epoxy group-containing unsaturated compound and acid groups derived from an acrylic resin, and addition reaction of cycloaliphatic epoxy groups derived from an cycloaliphatic epoxy group-containing unsaturated resin and acid groups derived from an acid group-containing unsaturated compound proceed easily since the reactivity of ring opening reaction of the epoxy groups is high, so that unsaturated groups which can be set with active energy ray can be introduced into the resin.

The chemical bond generated by chemical reaction of the acid groups of the acrylic resin and the cycloaliphatic epoxy groups is a bond having relatively large steric hindrance, so that a film formed from the composition is chemically stable to a hydrolysis-accelerating substance (e.g. water, sea water, etc.), whereby remarkable effects which are excellent in durabilities such as water resistance, etc. can be obtained. Further, since a large number of hydrophobic groups are contained, there is observed an effect that the active energy ray-setting resin composition does not absorb water. By both of the effects, the composition of the present invention is extremely excellent in electric characteristics as compared with a novolak type epoxy-modified resin. As compared with the sensitivity of a novolak type epoxy acrylate acid adduct composition, the sensitivity of the composition of the present invention is double or more, resolution property in the case of using a substrate subjected to blackening treatment of a multilayer printed wiring board is excellent, and setting of a coating film proceeds rapidly, whereby irradiation of UV rays after final setting is not required. Further, since setting property is excellent, soldering heat resistance, particularly water-soluble flux resistance is excellent.

However, the adhesiveness greatly decreases after boiling in water or after a thermal hysteresis. Although the composition has a good developability initially, the developability greatly decreases after the composition is allowed to stand at ambient temperature for 2 or 3 days. It has also been found that an ink prepared therefrom becomes unusable in one month after preparation.

Contrariwise, a photosensitive prepolymer (a novolak type epoxy-acrylate acid adduct) is introduced into the composition of the present invention for the purpose of making the best use of the characteristic feature of the active energy ray-setting resin and further improving the properties of the composition. By using these materials in the form of a mixture, the problems of individual resins can be solved.

Further, a setting adhesion-imparting agent is incorporated into the composition of the present invention, by which adhesiveness can be improved and the fault of the active energy ray-setting resin can be overcome.

That is, the greatest characteristic of the photosensitive thermosetting resin composition of the present invention resides in that a mixture of a specific active energy ray-setting resin and a photosensitive prepolymer (a novolak type epoxy-acrylate acid adduct) is used, and the setting adhesion-imparting agent is used in combination. A desired solder resist pattern for a printed wiring board, which is excellent in various characteristics can be formed by coating the composition, carrying out drying, exposure and development and then thermosetting the resin together with the epoxy compound by heating or reacting it with the photosensitive prepolymer.

In the following, the respective constituting components of the photosensitive thermosetting resin composition of the present invention are described.

The unsaturated monobasic acid copolymer resin to be used for preparing the unsaturated resin (a-1) obtained by reaction of the unsaturated monobasic acid copolymer resin and the cycloaliphatic epoxy group-containing unsaturated compound of the present invention is preferably an acid group-containing acrylic resin. As said acid group-containing acrylic resin, there may be used a conventionally known copolymer obtained by copolymerizing an ethylenic unsaturated acid such as (meth)acrylic acid, 2-carboxyethyl (meth)acrylate, 2-carboxypropyl (meth)acrylate, maleic acid (anhydride), etc. with one or more monomers selected from esters of (meth)acrylic acid [e.g. methyl (meth)acrylate, ethyl (meth)acrylate, propyl (meth)acrylate, butyl (meth)acrylate, 2-ethylhexyl (meth)acrylate, stearyl (meth)acrylate, hydroxyethyl (meth)acrylate, hydroxypropyl (meth)acrylate, etc.], a lactone-modified hydroxyalkyl (meth)acrylate [e.g. a compound obtained by modifying a 2-hydroxyalkyl (meth)acrylate such as 2-hydroxyethyl (meth)acrylate, 2-hydroxypropyl (meth)acrylate, 2-hydroxybutyl (meth)acrylate, etc. with δ-valerolactone, ε-caprolactone or the like], a vinyl aromatic compound [e.g. styrene, α-methylstyrene, vinyltoluene, p-chlorostyrene, etc.], an amide type unsaturated compound [e.g. (meth)acrylamide, diacetonacrylamide, N-methylolacrylamide, N-butoxymethylacrylamide, etc.], a polyolefin type compound [e.g. butadiene, isoprene, chloroprene, etc.] and other monomer [e.g. (meth)acrylonitrile, methyl isopropenyl ketone, vinyl acetate, Beobamonomer (a product of Shell Chemical), vinyl propionate, vinyl pivalate, etc.].

In the above unsaturated monobasic acid copolymer resin, it is necessary to impart photosetting property to the resin by reacting a part of the acid groups of said resin with the epoxy groups of the cycloaliphatic epoxy group-containing unsaturated compound to introduce unsaturated groups into the resin. Therefore, it is necessary to control the acid value of the unsaturated monobasic acid copolymer resin suitably. The acid value is in the range of 15 or more, preferably 30 to 260. Further, as the cycloaliphatic epoxy group-containing unsaturated compound to be reacted with said resin, there may be mentioned a compound having one radical polymerizable unsaturated group and one cycloaliphatic epoxy group in one molecule, for example, a compound having an acroyloxy group or an acroyloxyalkyl (the carbon number of the alkyl group is 1 to 6) group on a ring of an cycloaliphatic epoxy compound, specifically 3,4-epoxycyclohexylmethyl (meth)acrylate, 3,4-epoxycyclohexylethyl (meth)acrylate, 3,4-epoxycyclohexylbutyl (meth)acrylate and 3,4-epoxycyclohexylmethyl aminoacrylate.

The reaction of the unsaturated monobasic acid copolymer resin and the cycloaliphatic epoxy group-containing unsaturated compound is carried out by, for example, reacting a solution of the unsaturated monobasic acid copolymer resin in an inactive organic solvent (e.g. an alcohol type, ester type, aromatic hydrocarbon type or aliphatic hydrocarbon type solvent, etc.) with the cycloaliphatic epoxy group-containing unsaturated compound at about 20 to 120° C. for about 1 to 5 hours. In the obtained resin having unsaturated groups, the number of the unsaturated groups per the molecular weight of 1,000 is in the range of 0.2 to 4.0, preferably 0.7 to 3.5. If the number of the unsaturated groups is less than 0.2, the setting property of the film is insufficient, and thus adhesion property to a material to be coated, water resistance, etc. are poor. On the other hand, if the number of the unsaturated groups is more than 4.0, thickening or gelation might be caused undesirably during the addition reaction with the acid group-containing resin.

The number average molecular weight of the resin is in the range of 1,000 to 100,000, preferably 3,000 to 20,000. If the molecular weight is more than 100,000, the resin has high viscosity, resulting in inconvenient handling, and also film-forming property is worsened undesirably to give a film having poor adhesion property to a material to be coated. The preferred acid value of the resin is 40 to 250 mgKOH/g, but when weak alkali is used, the resin having an acid value not in this range, but in the range of 10 to 250 mgKOH/g can be used. Even if the acid value is 10 or less$^{(sic)}$, development can be carried out by using a solvent, while if the acid value is 250 mgKOH/g or more$^{(sic)}$, the water resistance of the film is poor undesirably.

As an cycloaliphatic epoxy group-containing copolymer resin component for preparing the unsaturated resin (a-2) by reaction of the cycloaliphatic epoxy group-containing copolymer resin and the acid group-containing unsaturated compound of the present invention, there may be mentioned a compound having one radical polymerizable unsaturated group and one cycloaliphatic epoxy group in one molecule [the above 3,4-epoxycyclohexylmethyl (meth)acrylate, 3,4-epoxycyclohexylethyl (meth)acrylate, 3,4-epoxycyclohexylbutyl (meth)acrylate, 3,4-epoxycyclohexylmethyl aminoacrylate, etc.] and the above copolymer obtained by copolymerization with one or more acrylic or vinyl monomers. As the acid group-containing unsaturated compound to be reacted with the epoxy groups of the cycloaliphatic epoxy group-containing copolymer resin to introduce unsaturated groups into the resin, there may be mentioned an ethylenic unsaturated acid such as (meth)acrylic acid, 2-carboxyethyl (meth)acrylate, 2-carboxypropyl (meth)acrylate, maleic acid (anhydride), etc.

As the cycloaliphatic epoxy group-containing copolymer resin ingredient used for production of the unsaturated resin (a-2) of the present invention obtained by reacting a cycloaliphatic epoxy group-containing copolymer resin with an acid group-containing unsaturated compound, there can be referred to copolymers obtained by using a compound having one radical-polymerizable unsaturated group and a cycloaliphatic epoxy group in one molecule such as the above-mentioned 3,4-epoxycyclohexylmethyl (meth) acrylate, 3,4-epoxycyclohexylethyl (meth)acrylate, 3,4-epoxycyclohexyl-butyl (meth)acrylate, 3,4-epoxycyclohexylmethylamino acrylate or the like and the above-mentioned acryl or vinyl monomer as essential ingredients and copolymerizing these monomers with one or more monomers selected from the same monomers as used in the preparation of the above-mentioned unsaturated monobasic acid copolymer resin such as (meth)acrylic esters, vinyl aromatic compounds or the like.

The reaction of the cycloaliphatic epoxy group-containing copolymer resin and the acid group-containing unsaturated compound is carried out by, for example, reacting a solution of the cycloaliphatic epoxy group-containing copolymer resin in an inactive organic solvent with the cycloaliphatic epoxy$^{(sic)}$ group-containing unsaturated compound at about 20 to 110° C. for about 1 to 7 hours. The preferred ranges of the molecular weight, the number of unsaturated groups, the acid value, etc. of the obtained resin having unsaturated groups are the same as in the case of the above unsaturated resin (a-1).

The resin represented by the following formula is one preferred example of the active energy ray-setting resin to be used in the present invention:

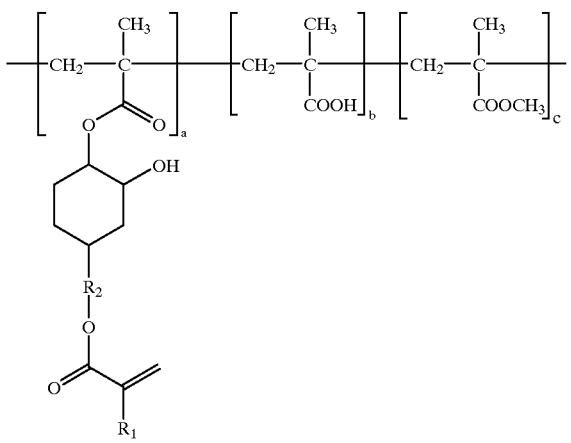

(wherein $R_1$ represents a hydrogen atom or a methyl group, $R_2$ represents a divalent aliphatic saturated hydrocarbon group having 1 to 6 carbon atoms, and a, b and c each represent an integer of 0 to 10, provided that a represents at least 1.)

In the above formula, as $R_2$, there may be mentioned a straight or branched alkylene group, for example, methylene, ethylene, propylene, tetramethylene, ethylethylene, pentamethylene, hexamethylene, etc. With respect to the ratio of the above a, b and c, a:b:c=5:3:2 is most preferred. Further, with respect to the ranges of an acid value and a molecular weight, the most stable composition having excellent characteristics can be obtained in the range of an acid value of 60 to 90 mgKOH/g and a molecular weight of 400 to 6,000.

A preferred example of the active energy ray-setting resin of the present invention is an unsaturated resin obtained by adding epoxy groups of an cycloaliphatic epoxy compound substituted by acroyloxyalkyl groups to a part of carboxyl groups of a vinyl copolymer containing (meth)acrylic acid and lactone-modified hydroxyalkyl (meth)acrylate as a comonomer component, disclosed in Japanese Unexamined Patent Publication No. 41150/1996. As such an unsaturated resin, ACA-250 produced by Daicel Chemical Industries, Ltd. is available.

In the active energy ray-setting type unsaturated resin composition of the present invention, the conventionally known photosensitive prepolymer (b-1), (b-2) or (b-3) may be formulated suitably depending on use and required coating film properties. These photosensitive prepolymers may be formulated in the range of 50 parts by weight or less, preferably 5 to 30 parts by weight based on 100 parts by weight of the resin solid content of the active energy ray-setting resin composition.

The photosensitive prepolymer (b-1) is a prepolymer having an acid value of 40 to 160 mgKOH/g, obtained by reacting a product in which an etirely esterified product produced by esterification reaction of a novolak type epoxy compound and an α,β-unsaturated carboxylic acid, with a saturated or unsaturated polybasic acid anhydride.

The photosensitive prepolymer (b-2) is a prepolymer having an acid value of 40 to 160 mgKOH/g, obtained by reacting a product in which a partially esterified product produced by esterification reaction of a novolak type epoxy compound and an α,β-unsaturated carboxylic acid, with a saturated or unsaturated polybasic acid anhydride.

As the novolak type epoxy compound to be used in the above entirely esterified or partially esterified product, there may be mentioned YDCN-701, YDCN-704, YDPN-638 and YDPN-602 produced by Tohto Kasei Co.; DEN-431 and DEN-439 produced by Dow Chemical Co.; EPN-1138, EPN-1235 and EPN-1299 produced by Ciba Geigy AG.; N-730, N-770, N-865, N-665, N-673, N-695, VH-4150, VH-4240 and VH-4440 produced by Dainippon Ink & Chemicals, Inc.; EOCN-120, EOCN-104 and BRRN-1020 produced by Nippon Kayaku Co., Ltd.; ECN-265, ECN-293, ECN-285 and ECN-299 produced by Asahi Chemical Industry Co., Ltd., etc. A part or all of the novolak type epoxy compound can be replaced with a bisphenol A type, bisphenol F type, hydrogenated bisphenol A type, brominated bisphenol A type or glycidyl ether type epoxy compound such as amino group-containing, cycloaliphatic, polybutadiene-modified or the like, e.g. Epicoat 828, Epicoat 1007 and Epicoat 807 produced by Yuka Shell Co.; Epiculon 840, Epiculon 860, Epiculon 3050 and Epiculon 830 produced by Dainippon Ink & Chemicals Inc.; DER-330, DER-337 and DER-361 produced by Dow Chemical Co.; Celloxide 2021 and Celloxide 3000 produced by Dicel Chemical Idustris, Ltd.; TETRAD-X and TETRAD-C produced by Mitsubishi Gas Chemical Co. Inc.; EPB-13 and EPB-27 produced by Nippon Soda Co. Ltd.; YD-116, YD-128, YD-013, YD-020, YDG-414, ST-3000, ST-110, YDF-190, YDF-2004 and YDF-2007 produced by Tohto Kasei Co.; GY-260, GY-255 and XB-2615 produced by Ciba Geigy AG.: DER-332, DER-662 and DER-542 produced by Dow Chemical Co., etc. It is particularly preferred to use a cresol novolak type epoxy compound as a solder resist for a printed wiring board.

Next, as the above-mentioned unsaturated monocarboxylic acid, there may be used acrylic acid, methacrylic acid, β-styrylacrylic acid, β-furfurylacrylic acid, crotonic acid, α-cyanocinnamic acid, cinnamic acid, etc., and half esters of a saturated or unsaturated dibasic acid anhydride and a (meth)acrylate having one hydroxy group in one molecule, or half esters of a saturated or unsaturated dibasic acid and an unsaturated monoglycidyl compound, for example, a half ester obtained by reacting a saturated or unsaturated dibasic acid anhydride such as phthalic acid, tetrahydrophthalic acid, hexahydrophthalic acid, maleic acid, succinic acid, itaconic acid, chlorendic acid, methylhexahydrophthalic acid, methyl-end methylenetetrahydrophthalic acid, methyltetrahydrophthalic acid, etc. with hydroxyethyl acrylate, hydroxypropyl acrylate, hydroxybutyl acrylate, polyethylene glycol monoacrylate, glycerin acrylate, trimethylolpropane diacrylate, pentaerythritol triacrylate, dipentaerythritol pentaacrylate, diacrylate of triglycidyl isocyanurate or a methacrylate corresponding to the above acrylate, or the above saturated or unsaturated dibasic acid with glycidyl (meth)acrylate at an equimolar ratio according to a conventional method, etc., singly or as a mixture, and acrylic acid is particularly preferably used.

As the above-mentioned saturated or unsaturated polybasic acid anhydride, there may be used an anhydride of phthalic acid, tetrahydrophthalic acid, hexahydrophthalic acid, maleic acid, succinic acid, itaconic acid, chlorendic acid, methylhexahydrophthalic acid, methyl-end methylenetetrahydrophthalic acid, methyltetrahydrophthalic acid, trimellitic acid, pyromellitic acid, benzophenonetetracarboxylic acid, etc., particularly preferably tetrahydrophthalic acid anhydride or hexahydrophthalic acid anhydride.

The photosensitive prepolymer (b-3) is a prepolymer having an acid value of 40 to 160 mgKOH/g, obtained by reacting a reaction product obtained by reacting a reaction product of a diisocyanate and a (meth)acrylate having one hydroxy group in one molecule with secondary hydroxy groups of the above entirely esterified product, with a saturated or unsaturated polybasic acid anhydride.

As the above diisocyanate, there may be used tolylene diisocyanate, xylylene diisocyanate, hydrogenated xylylene diisocyanate, hexamethylene diisocyanate, isophorone diisocyanate, diphenylmethane diisocyanate, toluidine diisocyanate, lysine diisocyanate, etc., particularly preferably tolylene diisocyanate or isophorone diisocyanate.

Next, as the above (meth)acrylate having one hydroxy group in one molecule, there may be used hydroxyethyl acrylate, hydroxypropyl acrylate, hydroxybutyl acrylate, polyethylene glycol monoacrylate, glycerin diacrylate, trimethylolpropane diacrylate, pentaerythritol triacrylate, dipentaerythritol pentaacrylate and diacrylate of tris (hydroxyethyl) isocyanate or methacrylates corresponding to the above acrylates, etc., particularly preferably hydroxyethyl acrylate or pentaerythritol triacrylate.

The entirely esterified product and the saturated or unsaturated polybasic acid anhydride to be used for preparing the photosensitive prepolymer (b-3) are the same as those to be used for preparing the photosensitive prepolymer (b-1).

As the diluent (B) to be used in the present invention, there may be mentioned a photopolymerizable vinyl type monomer and/or an organic solvent. Representative examples of the photopolymerizable vinyl type monomer are hydroxyalkyl acrylates such as 2-hydroxyethyl acrylate, 2-hydroxybutyl acrylate, etc.; mono- or diacrylates of glycols such as ethylene glycol, methoxytetraethylene glycol, polyethylene glycol, propylene glycol, etc.; acrylamides such as N,N-dimethylacrylamide, N-methylolacrylamide, etc.; aminoalkyl acrylates such as N,N-dimethylaminoethyl acrylate, etc.; polyvalent acrylates of polyvalent alcohols or ethylene oxide or propylene oxide adducts thereof such as hexanediol, trimethylolpropane, pentaerythritol, dipentaerythritol, tris-hydroxyethyl isocyanurate, etc.; phenoxy acrylate, bisphenol A diacrylate and acrylates of ethylene oxide or propylene oxide adducts of these phenols, etc.; acrylates of glycidyl ethers such as glycerin diglycidyl ether, trimethylolpropane triglycidyl ether, triglycidyl isocyanurate, etc.; and melamine acrylate, and/or methacrylates corresponding to the above acrylates, etc.

On the other hand, as the organic solvent, there may be mentioned ketones such as ethyl methyl ketone, cyclohexanone, etc.; aromatic hydrocarbons such as toluene, xylene, tetramethylbenzene, etc.; glycol ethers such as methyl cellosolve, butyl cellosolve, methylcarbitol, butylcarbitol, propylene glycol monomethyl ether, dipropylene glycol monoethyl ether, triethylene glycol monoethyl ether, etc.; esters such as ethyl acetate, butyl acetate and esterified products of the above glycol ethers; alcohols such as ethanol, propanol, ethylene glycol, propylene glycol, etc.; aliphatic hydrocarbons such as octane, decane, etc.; a petroleum type solvent such as petroleum ether, petroleum naphtha, hydrogenated petroleum naphtha, solvent naphtha, etc. and others. The organic solvent is used for the purpose of diluting the resin so as to be coated easily.

The diluents (B) as described above are used singly or as a mixture of two or more of them. The suitable range of an amount to be used is 20 to 300 parts by weight, preferably 30 to 150 parts by weight based on 100 parts by weight of the above active energy ray-setting resin (A).

The purpose of using the above diluent is to dilute the active energy ray-setting resin so as to be coated easily and also to strengthen photopolymerizability in the case of the photopolymerizable vinyl type monomer, or to dissolve and dilute the photosensitive prepolymer, whereby the prepolymer can be coated in a liquid state and then dried to form a film in the case of the organic solvent. Therefore, depending on the diluent used, an exposure system of either a contact system in which a photomask is contacted with the coating film or a non-contact system is used.

As a representative example of the photopolymerization initiator (C) to be used in the present invention, there may be mentioned benzoins such as benzoin, benzyl, benzoin methyl ether, benzoin ethyl ether, benzoin n-propyl ether, benzoin isopropyl ether, benzoin n-butyl ether, etc.; benzoin alkyl ethers; benzophenones such as benzophenone, p-methylbenzophenone, Michler's ketone, methylbenzophenone, 4,4'-dichlorobenzophenone, 4,4'-bisdiethylaminobenzophenone, etc.; acetophenones such as acetophenone, 2,2-dimethoxy-2-phenylacetophenone, 2,2-diethoxy-2-phenylacetophenone, 1,1-dichloroacetophenone, 1-hydroxycyclohexylphenyl ketone, 2-methyl-[4-(methylthio)phenyl]-2-morpholino-1-propanone, N,N-dimethylaminoacetophenone, etc.; thioxanthones such as 2,4-dimethylthioxanthone, 2,4-diethylthioxanthone, 2-chlorothioxanthone, 2,4-diisopropylthioxanthone, etc.; anthraquinones such as anthraquinone, chloroanthraquinone, 2-methylanthraquinone, 2-ethylanthraquinone, 2-tert-butylanthraquinone, 1-chloroanthraquinone, 2-amylanthraquinone, 2-aminoanthraquinone, etc.; ketals such as acetophenonedimethylketal, benzyldimethylketal, etc.; benzoates such as ethyl 4-dimethylaminobenzoate, 2-(dimethylamino)ethyl benzoate, ethyl p-dimethylbenzoate, etc.; phenyl disulfide 2-nitrofluorene, butyroin, anisoin ethyl ether, azobisisobutyronitrile, tetramethylthiuram disulfide, etc. These photopolymerization initiators can be used singly or in combination of two or more of them.

The suitable range of the amount of these photopolymerization initiators C to be used is in the range of about 0.1 to 10% by weight based on the above active energy ray-setting resin.

Further, for the purpose of accelerating photopolymerization reaction by the above photopolymerization initiator, a photosensitizer may be used in combination. As a representative example of such a photosensitizer, there may be mentioned, for example, known photosensitizers including tertiary amines such as triethylamine, triethanolamine, 2-dimethylaminoethanol, etc., alkylphosphines represented by triphenylphosphine, and thiols represented by β-thioglycol.

Next, as the setting adhesion-imparting agent (D), S-triazine compounds, for example, melamine, ethyidiamino-S-triazine, 2,4-diamino-S-triazine, 2,4-diamino-6-tolyl-S-triazine, 2,4-diamino-6-xylyl-S-triazine and similar products thereof are available, and there may be mentioned guanamines such as guanamine, acetoguanamine, benzoguanamine, 3,9-bis[2-(3,5diamino-2,4,6-triazaphenyl)ethyl] 2,4,8,10tetraoxaspiro[5.5]undecane, etc. This S-triazine compound, etc. not only become a latent setting agent of the epoxy resin, but also have effects of improving adhesive strength of a resist substrate and also preventing electrolytic corrosion and discoloration of copper.

As the imidazole derivative, there may be mentioned 2HZ.2E4HZ, C11Z, C17Z, 2PZ, 1B2HZ, 2HZ-CN, 2E4HZ-CN, C11Z-CN, 2PZ-CN, 2P11Z-CN, 2HZ-CNS, 2E4HZ-CNS, 2PZ-CNS, 2HZ-AZINE, 2E4HZ-AZINE, C11Z-AZINE, 2MA-OK, 2P4MHZ, 2PHZ, 2P4BHZ, etc. produced by Shikoku Chemicals Corporation which accelerate setting adhesion.

Further, there may be mentioned polyamines such as diaminodiphenylmethane, m-phenylenediamine, diaminodiphenylsulfone, cyclohexylamine, m-xylylenediamine, 4,4'-diamino-3,3'-diethyldiphenylmethane, diethylenetriamine, tetraethylenepentamine, N-aminoethylpiperazine, isophoronediamine, dicyandiamide, urea, a urea derivative, polybasic hydrazide, etc. and organic acid salts and/or epoxy adducts thereof; an amine complex of boron trifluoride; tertiary amines such as trimethylamine, triethanolamine, N,N-dimethyloctylamine, N,N-dimethylaniline, N-benzyidimethylamine, pyridine, N-methylpyridine, N-methylmorpholine, hexamethoxymethylmelamine, 2,4,6-tris(dimethylaminophenol), N-cyclohexyldimethylamine, tetramethylguanidine, m-aminophenol, etc.; organic phosphines such as tributylphosphine, triphenylphosphine, tris-2-cyanoethylphosphine, etc.; phosphonium salts such as tri-n-butyl(2,5-dihydroxyphenyl)phosphonium bromide, hexadecyltributylphosphonium chloride, etc.; quaternary ammonium salts such as benzyltrimethylammonium chloride, phenyltributylammonium chloride, benzyltrimethylammonium bromide, etc.; a cationic photopolymerization catalyst such as diphenyliodonium tetrafluoroborate, triphenylsulfonium hexafluoroantimonate, 2,4,6-triphenylthiopyrylium hexafluorophosphate, Irgacure 261 produced by Ciba Geigy AG, etc.; a styrene-maleic acid resin, a silane coupling agent, etc.

It is sufficient that the amount of the setting adhesion-imparting agent (D) as described above to be used is a general quantitative rate. For example, when dicyandiamide, mercaptotriazole and a silane coupling agent are used with the active energy ray-setting resin of the present invention, since adhesion property to copper is excellent, adhesion property to a rust preventive used for preventing oxidation is improved. With respect to the ratio thereof, 0.5 to 5% by weight of a mixture of the setting adhesion-imparting agents at a ratio of 1:1:0.5 is mixed based on 100 parts by weight of the active energy ray-setting resin.

Next, as the compound (E) having epoxy groups, there may be used a solid or liquid known epoxy compound, and said epoxy compound is used depending on required characteristics. For example, when plating resistance is to be improved, a liquid epoxy resin is used, and when water resistance is required, an epoxy resin having a large number of methyl groups on a benzene ring or a cyclo ring. As a preferred epoxy resin, there may be mentioned a bisphenol S type epoxy resin such as BPS-200 produced by Nippon Kayaku Co., Ltd., EPX-30 produced by ACR Co., Epiculon EXA-1514 produced by Dainippon Ink & Chemicals Inc., etc.; a diglycidyl phthalate resin such as Blemmer DGT produced by Nippon Oil and Fats Co., Ltd., etc.; a heterocyclic epoxy resin such as TEPIC produced by Nissan Chemical Industries, Ltd., Araldite PT810 produced by Ciba Geigy AG., etc.; a bixylenol type epoxy resin such as YX-4000 produced by Yuka Shell Co., etc.; a bisphenol type epoxy resin such as YL-6056 produced by Yuka Shell Co., etc.; a tetraglycidyl xylenoylethane resin such as ZX-1063 produced by Tohto Kasei Co., etc.; a novolak type epoxy resin such as EPPN-201, EOCN-103, EOCN-1020, EOCN-1025 and BRRN produced by Nippon Kayaku Co., Ltd., ECN-278, ECN-292 and ECN-299 produced by Asahi Chemical Industry Co., Ltd., ECN-1273 and ECN-1299 produced by Ciba Geigy AG., YDCN-220L, YDCN-220HH, YDCN-702, YDCN-704, YDPN-601 and YDPN-602 produced by Tohto Kasei Co., Epiculon-673, N-680, N-695, N-770 and N-775 produced by Dainippon Ink & Chemicals Inc., etc.; a novolak type epoxy resin of bisphenol A such as EPX-8001, EPX-8002, EPPX-8060 and EPPX-8061 produced by Asahi Chemical Industry Co., Ltd., Epiculon N-880 produced by Dainippon Ink & Chemicals Inc., etc.; a chelate type epoxy resin such as EPX-49-69 and EPX-49-30 produced by Asahi Denka Kogyo K.K., etc.; a glyoxal type epoxy resin such as YDG-414 produced by Tohto Kasei Co., etc.; an amino group-containing epoxy resin such as YH-1402 and ST-110 produced by Tohto Kasei Co., YL-931 and YL-933 produced by Yuka Shell Co., etc.; a rubber-modified epoxy resin such as Epiculon TSR-601 produced by Dainippon Ink & Chemicals Inc., EPX-84-2 and EPX-4061 produced by Asahi Denka Kogyo K.K., etc.; a dicyclopentadiene phenolic type epoxy resin such as DCE-400 produced by Sanyo-Kokusaku Pulp Co., Ltd., etc.; a silicone-modified epoxy resin such as X-1359 produced by Asahi Denka Kogyo K.K., etc.; an ε-caprolactone-modified epoxy resin such as Plaque G-402 and G-710 produced by Dicel Chemical Industries, Ltd., etc. and others. Further, partially esterified compounds by (meth)acrylates of these epoxy compounds can be used in combination.

The formulation ratio of the compound (E) having epoxy groups to the mixture of the active energy ray-setting resin and said photosensitive prepolymer (A) is 75 or more:25 or less, preferably 80 or more:20 or less in terms of weight ratio. If the ratio of (E) exceeds 25, the solubility of an unexposed portion with a developing solution is lowered to give an undeveloped portion easily in the case of alkali development, and the coating film is eroded to cause falling or blistering of the coating film easily in the case of solvent development, which makes practical use difficult.

The carboxyl groups of the active energy ray-setting resin (A) and the epoxy groups of the epoxy compound (E) are reacted by ring opening polymerization, and when a particulate epoxy resin is used, it is necessary to use a setting agent in combination. When the setting adhesion-imparting agent (D) is used in combination at the above formulation ratio, sufficient crosslinking is effected to improve water resistance and heat resistance, particularly water-soluble flux resistance and electroless gold plating resistance. Therefore, the composition maintains characteristics which are not possessed by a novolak type epoxy resin-modified solder resist and functions as an excellent solder resist sufficiently.

In the photosensitive thermosetting resin composition of the present invention, for the purpose of improving characteristics such as adhesion property, hardness, etc., if necessary, there may be used a known inorganic filler such as barium sulfate, barium titanate, silicon oxide powder, particulate silicon oxide, amorphous silica, talc, clay, magnesium carbonate, calcium carbonate, aluminum oxide, aluminum hydroxide, mica powder, etc. Its formulation ratio is 0 to 60% by weight, preferably 5 to 40% by weight of the photosensitive thermosetting resin composition.

Further, if necessary, there may be used known additives such as a known coloring agent such as Phthalocyanine Blue, Phthalocyanine Green, Iodine Green, Disazo Yellow, Crystal Violet, titanium oxide, carbon black, naphthalene black, etc., a known thermopolymerization inhibitor such as hydroquinone, hydroquinone monomethyl ether, tert-butylcatechol, pyrogallol, phenothiazine, etc., a known thickener such as asbestos, orbene, bentone, montmorillonite, etc., a silicone type, fluorine type or high molecular weight type defoaming agent and/or a leveling agent and an antioxidant.

A diallyl phthalate prepolymer or a diallyl isophthalate prepolymer which is an allyl compound can be added as an organic filler, and by addition of these prepolymers, chemical resistance can be improved. The amount to be added is up to 30 parts by weight, preferably up to 20 parts by weight based on 100 parts by weight of the active energy ray-setting resin. As said prepolymer, Daiso-Dap and Daiso-Isodap produced by Osaka Soda Co., Ltd., etc. are available, and a prepolymer having an average molecular weight of 2,000 to 30,000 is used. A diallyl isophthalate prepolymer having an average molecular weight of 5,000 to 20,000 is particularly preferred.

For the purpose of increasing impact resistance of a set coating film, there may be used copolymers of ethylenic unsaturated compounds such as acrylates, etc., a known binder resin such as polyester resins synthesized from a polyvalent alcohol and a saturated or unsaturated polybasic acid compound, etc., and a known photosensitive oligomer such as polyester (meth)acrylates synthesized from a polyvalent alcohol, a saturated or unsaturated polybasic acid compound and glycidyl (meth)acrylate, and urethane (meth)acrylates synthesized from a polyvalent alcohol, a diisocyanate and a hydroxy group-containing (meth)acrylate, etc. in the range which does not exert influence on various characteristics as a solder mask. However, among the above components, with respect to the copolymers of ethylenic unsaturated compounds such as acrylates, etc. and the binder material such as polyester resins, etc., if the amount of the copolymers and the known binder resin having no photosensitive group to be used is large, there are problems that developability and sensitivity are worsened, etc., so that the amount to be used is desirably 10% by weight or less based on the active energy ray-setting resin (about 5% by weight or less of the whole composition).

The developing solution for forming a solder resist pattern after exposing the photosensitive thermosetting resin composition of the present invention through a photomask varies depending on selection of the active energy ray-setting resin, but as the organic solvent, there may be used an organic solvent such as cyclohexanone, xylene, tetramethylbenzene, butyl cellosolve, butylcarbitol, propylene glycol monomethyl ether, cellosolve acetate, propanol, propylene glycol, trichloroethane, trichloroethylene, modified trichloroethane (Ethana IR produced by Asahi Chemical Industry Co., Ltd., Three One EX-R produced by Toa Gosei Chemical Industry Co., Ltd., Kandentriethan SR-A produced by Kanto Denka Kogyo Co., Ltd. and Resi Solve V-5 produced by Asahi Glass Company, Limited), etc., and/or an alkaline aqueous solution of potassium hydroxide, sodium hydroxide, sodium carbonate, potassium carbonate, sodium phosphate, sodium silicate, ammonia, amines or the like, and/or an aqueous surfactant solution, etc.

The photosetting thermosetting resin composition of the present invention is coated on a substrate so as to have a desired thickness and then heated at 60 to 80° C. for 15 to 60 minutes to volatilize the organic solvent. Then, a desired pattern in which an image portion is transparent is placed in a contacted state on the coating film of the substrate, and the desired pattern is exposed selectively by irradiating UV rays. By exposure, the composition in the exposed region of the coating film generates crosslinking to become insoluble. Next, by removing the unexposed region with a dilute alkaline aqueous solution, the coating film is developed. The dilute alkaline aqueous solution to be used here is generally a 0.5 to 5% by weight aqueous sodium carbonate solution. As a matter of course, other alkali can be also used. In order to improve heat resistance, it is desired to apply UV rays, heat at 100 to 200° C. or far infrared rays later to the pattern thus obtained to effect secondary setting.

In the following, the present invention is described specifically by referring to Preparation examples, Examples and Comparative examples, but the present invention is not limited thereto. "Part" and "%" are all based on weight unless otherwise indicated.

PREPARATION EXAMPLE 1 (UNSATURATED RESIN)

A mixed solution comprising 20 parts by weight of methyl methacrylate, 20 parts by weight of styrene, 25 parts by weight of methyl acrylate, 15 parts by weight of 2-hydroxyethyl methacrylate, 20 parts by weight of acrylic acid and 5 parts by weight of azobisisobutyronitrile was added dropwise over 3 hours to 60 parts by weight of butyl cellosolve in a reactor maintained at 105° C. under nitrogen gas atmosphere. After dropwise addition, the mixture was aged for 1 hour. A mixed solution comprising 1 part by weight of azobisdimethylvaleronitrile and 7 parts by weight of butyl cellosolve was added dropwise over 1 hour to the mixture, and the resulting mixture was further aged for 5 hours to obtain a high acid value acrylic resin (acid value:150) solution. Next, to this solution were added 25 parts by weight of 3,4-epoxycyclohexylmethyl methacrylate and 0.06 part by weight of hydroquinone, and the mixture was reacted at 80° C. for 5 hours while blowing air into the mixture to obtain a solution of an unsaturated resin (acid value:60, the number of unsaturated groups:1.1/molecular weight of 1,000, number average molecular weight:10,000).

PREPARATION EXAMPLE 2 (UNSATURATED RESIN)

A mixed solution comprising 30 parts by weight of styrene, 35 parts by weight of butyl acrylate, 35 parts by weight of acrylic acid and 3 parts by weight of azobisisobutyronitrile was added dropwise over 3 hours to 60 parts by weight of diethylene glycol dimethyl ether in a reactor maintained at 110° C. under nitrogen gas atmosphere. After dropwise addition, the mixture was aged for 1 hour. A mixed solution comprising 1 part by weight of azobisdimethylvaleronitrile and 20 parts by weight of diethylene glycol dimethyl ether was added dropwise over 1 hour to the mixture, and the resulting mixture was further aged for 5 hours to obtain a high acid value acrylic resin (acid value:260) solution. Next, to this solution were added 65 parts by weight of 3,4-epoxycyclohexylmethyl methacrylate and 0.14 part by weight of hydroquinone monomethyl ether, and the mixture was reacted at 80° C. for 5 hours while blowing air into the mixture to obtain a solution of an unsaturated resin (acid value:40, the number of unsaturated groups:1.4/molecular weight of 1,000, number average molecular weight:13,000).

PREPARATION EXAMPLE 3 (UNSATURATED RESIN)

A mixed solution comprising 30 parts by weight of styrene, 35 parts by weight of butyl acrylate, 35 parts by weight of acrylic acid and 3 parts by weight of azobisisobutyronitrile was added dropwise over 3 hours to 50 parts by weight of n-butanol and 40 parts by weight of diethylene glycol dimethyl ether in a reactor maintained at 110° C. under nitrogen gas atmosphere. After dropwise addition, the mixture was aged for 1 hour. A mixed solution comprising 1 part by weight of azobisdimethylvaleronitrile and 40 parts by weight of diethylene glycol dimethyl ether was added dropwise over 1 hour to the mixture, and the resulting mixture was further aged for 5 hours to obtain a high acid value acrylic resin (acid value:260) solution. Next, to this solution were added 75 parts by weight of 3,4-epoxycyclohexylmethyl methacrylate and 0.14 part by weight of hydroquinone monomethyl ether, and the mixture was reacted at 80° C. for 5 hours while blowing air into the mixture to obtain a solution of an unsaturated resin (acid value:20, the number of unsaturated groups:1.98/molecular weight of 1,000, number average molecular weight:15,000).

PREPARATION EXAMPLE 4 (UNSATURATED RESIN)

A mixed solution comprising 40 parts by weight of butyl methacrylate, 35 parts by weight of butyl acrylate, 25 parts by weight of acrylic acid and 1 part by weight of azobisisobutyronitrile was added dropwise over 3 hours to 90 parts by weight of diethylene glycol dimethyl ether in a reactor maintained at 110° C. under nitrogen gas atmosphere. After dropwise addition, the mixture was aged for 1 hour. A mixed solution comprising 1 part by weight of azobisdimethylvaleronitrile and 10 parts by weight of diethylene glycol dimethyl ether was added over 1 hour to the mixture, and the resulting mixture was further aged for 5 hours to obtain a high acid value acrylic resin (acid value:184) solution. Next, to this solution were added 60 parts by weight of 3,4-epoxycyclohexylmethyl methacrylate and 0.12 part by weight of hydroquinone, and the mixture was reacted at 80° C. for 5 hours while blowing air into the mixture to obtain a solution of an unsaturated resin (acid value:0, the number of unsaturated groups:2.07/molecular weight of 1,000, number average molecular weight:30,000).

PREPARATION EXAMPLE 5 (UNSATURATED RESIN)

A mixed solution comprising 25 parts by weight of styrene, 23 parts by weight of butyl acrylate, 52 parts by weight of 3,4-epoxycyclohexylmethyl methacrylate and 3 parts by weight of t-butylperoxy-2-ethylhexynoate was added dropwise over 3 hours to 90 parts by weight of butyl cellosolve in a reactor maintained at 110° C. under nitrogen gas atmosphere. After dropwise addition, the mixture was aged for 1 hour. A mixed solution comprising 1 part by weight of t-butylperoxy-2-ethylhexynoate and 10 parts by weight of butyl cellosolve was added over 1 hour to the mixture, and the resulting mixture was further aged for 7 hours to obtain an cycloaliphatic epoxy group-containing acrylic resin solution. Next, to this solution were added 16 parts by weight of acrylic acid and 0.12 part by weight of hydroquinone, and the mixture was reacted at 80° C. for 7 hours while blowing air into the mixture to obtain a solution of an unsaturated resin (acid value:0, the number of unsaturated groups:1.8/molecular weight of 1,000, number average molecular weight:12,000).

PREPARATION EXAMPLE 6 (PHOTOSENSITIVE PREPOLYMER)

1090 parts of a cresol novolak type epoxy resin (YDCN-702 produced by Tohto Kasei Co.) having an epoxy equivalent of 215 was charged into a three-necked flask equipped with a stirrer and a cooling device and melted by heating at 90 to 100° C. and stirred. Next, to the resin were added 390 parts of acrylic acid, 1.0 part of hydroquinone and 2.0 parts of benzyldimethylamine. Next, the temperature of the mixture was elevated to 110 to 115° C., the mixture was reacted under stirring for 12 hours, and the reaction mixture was taken out from the reaction apparatus and cooled to room temperature to obtain a product entirely esterified by acrylic acid of the novolak type epoxy compound having an acid value of 3.0 mgKOH/g. 450 parts of this product, 125 parts of ethylcarbitol acetate and 125 parts of Ipsol #150 (produced by Idemitsu Oil Co.) were charged into a reaction apparatus and dissolved by heating to 70 to 80° C. Next, the 1 hydroxy group equivalent of the solution was reacted with 0.5 mole of tetrahydrophthalic acid anhydride. A solution of an acid anhydride adduct of the product entirely esterified by acrylic acid of the novolak type epoxy compound having an acid value of 58 mg KOH/g in an organic solvent was obtained.

PREPARATION EXAMPLE 7 (PHOTOSENSITIVE PREPOLYMER)

Reaction was carried out in the same manner as in Preparation example 6 except that the amount of acrylic acid was changed to 250 parts. A product partially esterified by acrylic acid of the novolak type epoxy compound having an acid value of 0.5 mgKOH/g was obtained. 450 parts of this product, 125 parts of ethycarbitol acetate and 125 parts of Ipsol #150 (produced by Idemitsu Oil Co.) were charged into a reaction apparatus and dissolved by heating to 70 to 80° C. Next, the 1 hydroxy group equivalent of the solution was reacted with 0.5 mole of tetrahydrophthalic acid anhydride. A solution of an acid anhydride adduct of the product partially esterified by acrylic acid of the novolak type epoxy resin having an acid value of 58 mgKOH/g in an organic solvent was obtained.

Example 1

| | |
|---|---|
| The resin obtained in Production Example 1 (unsaturated resin) | 30.0 parts |
| The resin obtained in Production Example 6 (photosensitive prepolymer) | 10.0 parts |
| Dipentaerythritol hexaacrylate | 13.0 parts |
| Trimethylolpropane acrylate | 4.0 parts |
| Irgacure 369 (manufd. by Ciba Geigy Co.) | 3.0 parts |
| Isopropylthioxanthone | 1.0 part |
| Barium sulfate | 16.0 parts |
| Finely powdered talc | 3.0 parts |
| Aerosil #200 (manufd. by Japan Aerosil) | 1.0 part |
| Phthalocyanine Green | 0.5 part |
| Flowlen AC-300 (manufd. by Kyoueisha Yushi Co.) | 1.0 part |
| Dicyandiamide | 1.0 part |
| Mercaptotriazole | 1.0 part |
| Silane coupler | 0.5 part |
| YX-4000 (manufd. by Yuka Shell Co.) | 15.0 parts |
| Total | 100.0 parts |

The above-mentioned ingredients were preliminarily blended and then twice kneaded by means of a triple roll mill to prepare a photosensitive thermosetting resin composition. The composition had a particle size of 15 μm or less. The composition obtained herein was coated onto whole surface of a copper through-hole printed circuit board by the method of screen printing, introduced into a hot air circulation oven and dried at 80° C. for 20 minutes, and photo-cured by irradiating thereto an ultraviolet ray having a wavelength of 365 nm through an artwork at an integrated dose of 150 mJ/cm$^2$ as measured with an integrating photometer manufactured by Orc Seisakusho Co. Then, development was carried out in a 1% by weight aqueous solution of sodium carbonate as a developing solution at a spray pressure of 2.0 kg/cm$^2$ for 60 seconds, and then heat-cure was carried out for 60 minutes in a hot air circulation type curing oven kept at 150° C. to form a solder resist pattern.

Example 2

| | |
|---|---|
| The resin obtained in Production Example 1 (unsaturated resin) | 30.0 parts |
| The resin obtained in Production Example 7 (photosensitive prepolymer) | 10.0 parts |
| Dipentaerythritol hexaacrylate | 3.0 parts |
| Trimethylolpropane triacrylate | 4.0 parts |
| Irgacure 369 (manufd. by Ciba Geigy Co.) | 3.0 parts |
| Isopropylthioxanthone | 1.0 part |
| Barium sulfate | 16.0 parts |
| Finely powdered talc | 3.0 parts |
| Aerosil #200 (manufd. by Japan Aerosil) | 1.0 part |
| Phthalocyanine Green | 0.5 part |
| Flowlen AC-300 (manufd. by Kyoueisha Yushi Co.) | 1.0 part |
| Dicyandiamide | 1.0 part |
| Mercaptotriazole | 1.0 part |
| Silane coupler | 0.5 part |
| YX-4000 (manufd. by Yuka Shell Co.) | 15.0 parts |
| Total | 100.0 parts |

After a preliminary blending, these ingredients were twice kneaded by means of a triple roll mill to obtain a photosensitive thermosetting resin composition. Particle size of the composition thus obtained was 15 µm or less. A solder resist pattern was prepared from this photosensitive thermosetting resin composition by repeating the procedure of Example 1, except that the composition was coated on whole surface of a copper through-hole printed circuit board by the method of screen printing, and the coated matter was introduced into a hot air circulation type oven and dried at 80° C. for 20 minutes.

Example 4

| | |
|---|---|
| The resin obtained in Production Example 2 (unsaturated resin) | 30.0 parts |
| The resin obtained in Production Example 6 (photosensitive prepolymer) | 10.0 parts |
| Dipentaerythritol hexaacrylate | 13.0 parts |
| Trimethylolpropane acrylate | 4.0 parts |
| Irgacure 369 (manufd. by Ciba Geigy Co.) | 3.0 parts |
| Isopropylthioxanthone | 1.0 part |
| Barium sulfate | 16.0 parts |
| Finely powdered talc | 3.0 parts |
| Aerosil #200 (manufd. by Japan Aerosil) | 1.0 part |
| Phthalocyanine Green | 0.5 part |
| Flowlen AC-300 (manufd. by Kyoueisha Yushi Co.) | 1.0 part |
| Dicyandiamide | 1.0 part |
| Mercaptotriazole | 1.0 part |
| Silane coupler | 0.5 part |
| YX-4000 (manufd. by Yuka Shell Co.) | 15.0 parts |
| Total | 100.0 parts |

After a preliminary blending, these ingredients were twice kneaded by means of a triple roll mill to obtain a photosensitive thermosetting resin composition. Particle size of the composition thus obtained was 15 µm or less. A solder resist pattern was formed from this photosensitive thermosetting resin composition by repeating the procedure of Example 1, except that the composition was coated on whole surface of a copper through-hole printed circuit board by the method of screen printing, and the coated matter was introduced into a hot air circulation type oven and dried at 80° C. for 20 minutes.

Example 5

| | |
|---|---|
| The resin obtained in Production Example 3 (unsaturated resin) | 30.0 parts |
| The resin obtained in Production Example 6 (photosensitive prepolymer) | 10.0 parts |
| Dipentaerythritol hexaacrylate | 13.0 parts |
| Trimethylolpropane acrylate | 4.0 parts |
| Irgacure 369 (manufd. by Ciba Geigy Co.) | 3.0 parts |
| Isopropylthioxanthone | 1.0 part |
| Barium sulfate | 16.0 parts |
| Finely powdered talc | 3.0 parts |
| Aerosil #200 (manufd. by Japan Aerosil) | 1.0 part |
| Phthalocyanine Green | 0.5 part |
| Flowlen AC-300 (manufd. by Kyoueisha Yushi Co.) | 1.0 part |
| Dicyandiamide | 1.0 part |
| Mercaptotriazole | 1.0 part |
| Silane coupler | 0.5 part |
| YX-4000 (manufd. by Yuka Shell Co.) | 15.0 parts |
| Total | 100.0 parts |

After a preliminary blending, these ingredients were twice kneaded by means of a triple roll mill to obtain a photosensitive thermosetting resin composition. Particle size of the composition thus obtained was 15 µm or less. A solder resist pattern was formed from this photosensitive thermosetting resin composition by repeating the procedure of Example 1, except that the composition was coated on whole surface of a copper through-hole printed circuit board by the method of screen printing, the coated matter was introduced into a hot air circulation type oven and dried at 80° C. for 20 minutes, and 1% by weight solution of potassium hydroxide was used as the developer.

Example 6

| | |
|---|---|
| The resin obtained in Production Example 4 (unsaturated resin) | 30.0 parts |
| The resin obtained in Production Example 6 (photosensitive prepolymer) | 10.0 parts |
| Dipentaerythritol hexaacrylate | 13.0 parts |
| Trimethylolpropane acrylate | 4.0 parts |
| Irgacure 369 (manufd. by Ciba Geigy Co.) | 3.0 parts |
| Isopropylthioxanthone | 1.0 part |
| Barium sulfate | 16.0 parts |
| Finely powdered talc | 3.0 parts |
| Aerosil #200 (manufd. by Japan Aerosil) | 1.0 part |
| Phthalocyanine Green | 0.5 part |
| Flowlen AC-300 (manufd. by Kyoueisha Yushi Co.) | 1.0 part |
| Dicyandiamide | 1.0 part |
| Mercaptotriazole | 1.0 part |
| Silane coupler | 0.5 part |
| YX-4000 (manufd. by Yuka Shell Co.) | 15.0 parts |
| Total | 100.0 parts |

After a preliminary blending, these ingredients were twice kneaded by means of a triple roll mill to obtain a photosensitive thermosetting resin composition. Particle size of the composition thus obtained was 15 µm or less. A solder resist pattern was formed from this photosensitive thermosetting resin composition by repeating the procedure of Example 1, except that the composition was coated on whole surface of a copper through-hole printed circuit board by the method of screen printing, the coated matter was introduced into a hot air circulation type oven and dried at 80° C. for 20 minutes, and cyclohexanone was used as the developer.

Example 7

| | |
|---|---|
| The resin obtained in Production Example 5 (unsaturated resin) | 30.0 parts |
| The resin obtained in Production Example 6 (photosensitive prepolymer) | 10.0 parts |
| Dipentaerythritol hexaacrylate | 13.0 parts |
| Trimethylolpropane acrylate | 4.0 parts |
| Irgacure 369 (manufd. by Ciba Geigy Co.) | 3.0 parts |
| Isopropylthioxanthone | 1.0 part |
| Barium sulfate | 16.0 parts |
| Finely powdered talc | 3.0 parts |
| Aerosil #200 (manufd. by Japan Aerosil) | 1.0 part |
| Phthalocyanine Green | 0.5 part |
| Flowlen AC-300 (manufd. by Kyoueisha Yushi Co.) | 1.0 part |
| Dicyandiamide | 1.0 part |
| Mercaptotriazole | 1.0 part |
| Silane coupler | 0.5 part |
| YX-4000 (manufd. by Yuka Shell Co.) | 15.0 parts |
| Total | 100.0 parts |

After a preliminary blending, these ingredients were twice kneaded by means of a triple roll mill to obtain a photosensitive thermosetting resin composition. Particle size of the composition thus obtained was 15 μm or less as measured with Grindmeter manufactured by Erichsen Co. A solder resist pattern was formed from this photosensitive thermosetting resin composition by repeating the procedure of Example 1, except that the composition was coated on whole surface of a copper through-hole printed circuit board by the method of screen printing, the coated matter was introduced into a hot air circulation type oven and dried at 80° C. for 20 minutes, and cyclohexanone was used as the developer.

Example 8

| | |
|---|---|
| Active energy ray-setting resin [ACA-250, manufd. by Daicel Chemical] | 30.0 parts |
| The resin obtained in Production Example 6 (photosensitive prepolymer) | 10.0 parts |
| Dipentaerythritol hexaacrylate | 13.0 parts |
| Trimethylolpropane acrylate | 4.0 parts |
| Irgacure 369 (manufd. by Ciba Geigy Co.) | 3.0 parts |
| Isopropylthioxanthone | 1.0 part |
| Barium sulfate | 16.0 parts |
| Finely powdered talc | 3.0 parts |
| Aerosil #200 (manufd. by Japan Aerosil) | 1.0 part |
| Phthalocyanine Green | 0.5 part |
| Flowlen AC-300 (manufd. by Kyoueisha Yushi Co.) | 1.0 part |
| Dicyandiamide | 1.0 part |
| Mercaptotriazole | 1.0 part |
| Silane coupler | 0.5 part |
| YX-4000 (manufd. by Yuka Shell Co.) | 15.0 parts |
| Total | 100.0 parts |

After a preliminary blending, these ingredients were twice kneaded by means of a triple roll mill to obtain a photosensitive thermosetting resin composition. Particle size of the composition thus obtained was 15 μm or less as measured with Grindmeter manufactured by Erichsen Co. A solder resist pattern was formed from this photosensitive thermosetting resin composition by repeating the procedure of Example 1, except that the composition was coated on whole surface of a copper through-hole printed circuit board by the method of screen printing. Example 9

| | |
|---|---|
| Active energy ray-setting resin [ACA-250, manufd. by Daicel Chemical] | 30.0 parts |
| The resin obtained in Production Example 7 (photosensitive prepolymer) | 10.0 parts |
| Dipentaerythritol hexaacrylate | 13.0 parts |
| Trimethylolpropane acrylate | 4.0 parts |
| Irgacure 369 (manufd. by Ciba Geigy Co.) | 3.0 parts |
| Isopropylthioxanthone | 1.0 part |
| Barium sulfate | 16.0 parts |
| Finely powdered talc | 3.0 parts |
| Aerosil #200 (manufd. by Japan Aerosil) | 1.0 part |
| Phthalocyanine Green | 0.5 part |
| Flowlen AC-300 (manufd. by Kyoueisha Yushi Co.) | 1.0 part |
| Dicyandiamide | 1.0 part |
| Mercaptotriazole | 1.0 part |
| Silane coupler | 0.5 part |
| YX-4000 (manufd. by Yuka Shell Co.) | 15.0 parts |
| Total | 100.0 parts |

After a preliminary blending, these ingredients were twice kneaded by means of a triple roll mill to obtain a photosensitive thermosetting resin composition. Particle size of the composition thus obtained was 15 μm or less as measured with Grindmeter manufactured by Erichsen Co. A solder resist pattern was formed from this photosensitive thermosetting resin composition by repeating the procedure of Example 1, except that the composition was coated on whole surface of a copper through-hole printed circuit board by the method of screen printing, and the coated matter was introduced into a hot air circulation type oven and dried at 80° C. for 20 minutes.

Comparative Example 1

| | |
|---|---|
| The resin obtained in Production Example 1 (unsaturated resin) | 35.0 parts |
| Dipentaerythritol hexaacrylate | 15.0 parts |
| Trimethylolpropane acrylate | 4.0 parts |
| Irgacure 369 (manufd. by Ciba Geigy Co.) | 3.0 parts |
| Isopropylthioxanthone | 1.0 part |
| Barium sulfate | 19.0 parts |
| Finely powdered talc | 3.0 parts |
| Aerosil #200 (manufd. by Japan Aerosil) | 1.0 part |
| Phthalocyanine Green | 0.5 part |
| Flowlen AC-300 (manufd. by Kyoueisha Yushi Co.) | 1.0 part |
| Dicyandiamide | 1.0 part |
| Mercaptotriazole | 1.0 part |
| Silane coupler | 0.5 part |
| YX-4000 (manufd. by Yuka Shell Co.) | 15.0 parts |
| Total | 100.0 parts |

After a preliminary blending, the above-mentioned ingredients were twice kneaded by means of a triple roll mill to obtain a photosensitive thermosetting resin composition. Particle size of the composition was 15 μm or less as measured with Grindmeter manufactured by Erichsen Co. A solder resist pattern was formed from the photosensitive thermosetting resin composition thus obtained by repeating the procedure of Example 1, except that the composition was coated onto whole surface of a copper through-hole printed circuited board by the method of screen printing and the coated matter was introduced into a hot air circulation type oven and dried at 80° C. for 20 minutes.

Comparative Example 2

| | |
|---|---|
| The resin obtained in Production Example 1 (unsaturated resin) | 35.0 parts |
| Dipentaerythritol hexaacrylate | 15.0 parts |
| Trimethylolpropane acrylate | 4.0 parts |
| Irgacure 369 (manufd. by Ciba Geigy Co.) | 3.0 parts |
| Isopropylthioxanthone | 1.0 part |
| Barium sulfate | 20.5 parts |
| Finely powdered talc | 3.0 parts |
| Aerosil #200 (manufd. by Japan Aerosil) | 1.0 part |
| Phthalocyanine Green | 0.5 part |
| Flowlen AC-300 (manufd. by Kyoueisha Yushi Co.) | 1.0 part |
| Dicyandiamide | 1.0 part |
| YX-4000 (manufd. by Yuka Shell Co.) | 15.0 parts |
| Total | 100.0 parts |

After a preliminary blending, the above-mentioned ingredients were twice kneaded by means of a triple roll mill to obtain a photosensitive thermosetting resin composition. Particle size of the composition was 15 μm or less as measured with Grindmeter manufactured by Erichsen Co. A solder resist pattern was formed from the photosensitive thermosetting resin composition thus obtained by repeating the procedure of Example 1, except that the composition was coated onto whole surface of a copper through-hole printed circuited board by the method of screen printing and the coated matter was introduced into a hot air circulation type oven and dried at 80° C. for 20 minutes.

Comparative Example 3

| | |
|---|---|
| The resin obtained in Production Example 2 (unsaturated resin) | 35.0 parts |
| Dipentaerythritol hexaacrylate | 15.0 parts |
| Trimethylolpropane acrylate | 4.0 parts |
| Irgacure 369 (manufd. by Ciba Geigy) | 3.0 parts |
| Isopropylthioxanthone | 1.0 part |
| Barium sulfate | 19.0 parts |
| Finely powdered talc | 3.0 parts |
| Aerosil #200 (manufd by Japan Aerosil) | 1.0 part |
| Phthalocyanine Green | 0.5 part |
| Flowlen AC-300 (manufd. by Kyoueisha Yushi Co.) | 1.0 part |
| Dicyandiamide | 1.0 part |
| Mercaptotriazole | 1.0 part |
| Silane coupler | 0.5 part |
| YX-4000 (manufd. by Yuka Shell Co.) | 15.0 parts |
| Total | 100.0 parts |

After a preliminary blending, the above-mentioned ingredients were twice kneaded by means of a triple roll mill to obtain a photosensitive thermosetting resin composition. Particle size of the composition was 15 μm or less as measured with Grindmeter manufactured by Erichsen Co. A solder resist pattern was formed from the photosensitive thermosetting resin composition thus obtained by repeating the procedure of Example 1, except that the composition was coated onto whole surface of a copper through-hole printed circuited board by the method of screen printing, the coated matter was introduced into a hot air circulation type oven and dried at 80° C. for 20 minutes, and a 1% by weight solution of potassium hydroxide was used as the developer.

Comparative Example 4

| | |
|---|---|
| The resin obtained in Production Example 3 (unsaturated resin) | 35.0 parts |
| Dipentaerythritol hexaacrylate | 15.0 parts |
| Trimethylolpropane acrylate | 4.0 parts |
| Irgacure 369 (manufd. by Ciba Geigy) | 3.0 parts |
| Isopropylthioxanthone | 1.0 part |
| Barium sulfate | 19.0 parts |
| Finely powdered talc | 3.0 parts |
| Aerosil #200 (manufd by Japan Aerosil) | 1.0 part |
| Phthalocyanine Green | 0.5 part |
| Flowlen AC-300 (manufd. by Kyoueisha Yushi Co.) | 1.0 part |
| Dicyandiamide | 1.0 part |
| Mercaptothazole | 1.0 part |
| Silane coupler | 0.5 part |
| YX-4000 (manufd. by Yuka Shell Co.) | 15.0 parts |
| Total | 100.0 parts |

After a preliminary blending, the above-mentioned ingredients were twice kneaded by means of a triple roll mill to obtain a photosensitive thermosetting resin composition. Particle size of the composition was 15 μm or less as measured with Grindmeter manufactured by Erichsen Co. A solder resist pattern was formed from the photosensitive thermosetting resin composition thus obtained by repeating the procedure of Example 1, except that the composition was coated onto whole surface of a copper through-hole printed circuited board by the method of screen printing, the coated matter was introduced into a hot air circulation type oven and dried at 80° C. for 20 minutes, and a 1% by weight solution of potassium hydroxide was used as the developer.

Comparative Example 5

| | |
|---|---|
| The resin obtained in Production Example 4 (unsaturated resin) | 35.0 parts |
| Dipentaerythritol hexaacrylate | 15.0 parts |
| Trimethylolpropane acrylate | 4.0 parts |
| Irgacure 369 (manufd. by Ciba Geigy) | 3.0 parts |
| Isopropylthioxanthone | 1.0 part |
| Barium sulfate | 19.0 parts |
| Finely powdered talc | 3.0 parts |
| Aerosil #200 (manufd by Japan Aerosil) | 1.0 part |
| Phthalocyanine Green | 0.5 part |
| Flowlen AC-300 (manufd. by Kyoueisha Yushi Co.) | 1.0 part |
| Dicyandiamide | 1.0 part |
| Mercaptotriazole | 1.0 part |
| Silane coupler | 0.5 part |
| YX-4000 (manufd. by Yuka Shell Co.) | 15.0 parts |
| Total | 100.0 parts |

After a preliminary blending, the above-mentioned ingredients were twice kneaded by means of a triple roll mill to obtain a photosensitive thermosetting resin composition. Particle size of the composition was 15 μm or less as measured with Grindmeter manufactured by Erichsen Co. A solder resist pattern was formed from the photosensitive thermosetting resin composition thus obtained by repeating the procedure of Example 1, except that the composition was coated onto whole surface of a copper through-hole printed circuited board by the method of screen printing, the coated matter was introduced into a hot air circulation type oven and dried at 80° C. for 20 minutes, and cyclohexanone was used as the developer.

Comparative Example 6

| | |
|---|---:|
| The resin obtained in Production Example 5 (unsaturated resin) | 35.0 parts |
| Dipentaerythritol hexaacrylate | 15.0 parts |
| Trimethylolpropane acrylate | 4.0 parts |
| Irgacure 369 (manufd. by Ciba Geigy) | 3.0 parts |
| Isopropylthioxanthone | 1.0 part |
| Barium sulfate | 19.0 parts |
| Finely powdered talc | 1.0 part |
| Phthalocyanine Green | 0.5 part |
| Flowlen AC-300 (manufd. by Kyoueisha Yushi Co.) | 1.0 part |
| Dicyandiamide | 1.0 part |
| Mercaptotriazole | 1.0 part |
| Silane coupler | 0.5 part |
| YX-4000 (manufd. by Yuka Shell Co.) | 15.0 parts |
| Total | 100.0 parts |

After a preliminary blending, the above-mentioned ingredients were twice kneaded by means of a triple roll mill to obtain a photosensitive thermosetting resin composition. Particle size of the composition was 15 μm or less as measured with Grindmeter manufactured by Erichsen Co. A solder resist pattern was formed from the photosensitive thermosetting resin composition thus obtained by repeating the procedure of Example 1, except that the composition was coated onto whole surface of a copper through-hole printed circuited board by the method of screen printing, the coated matter was introduced into a hot air circulation type oven and dried at 80° C. for 20 minutes, and cyclohexanone was used as the developer.

Comparative Example 7

| | |
|---|---:|
| Active energy ray-setting resin [ACA-250, manufd. by Daicel Chemical] | 35.0 parts |
| Dipentaerythritol hexaacrylate | 15.0 parts |
| Trimethylolpropane acrylate | 4.0 parts |
| Irgacure 369 (manufd. by Ciba Geigy) | 3.0 parts |
| Isopropylthioxanthone | 1.0 part |
| Barium sulfate | 19.0 parts |
| Finely powdered talc | 3.0 parts |
| Aerosil #200 (manufd by Japan Aerosil) | 1.0 part |
| Phthalocyanine Green | 0.5 part |
| Flowlen AC-300 (manufd. by Kyoueisha Yushi Co.) | 1.0 part |
| Dicyandiamide | 1.0 part |
| Mercaptotriazole | 1.0 part |
| Silane coupler | 0.5 part |
| YX-4000 (manufd. by Yuka Shell Co.) | 15.0 parts |
| Total | 100.0 parts |

After a preliminary blending, the above-mentioned ingredients were twice kneaded by means of a triple roll mill to obtain a photosensitive thermosetting resin composition. Particle size of the composition was 15 μm or less as measured with Grindmeter manufactured by Erichsen Co. A solder resist pattern was formed from the photosensitive thermosetting resin composition thus obtained by repeating the procedure of Example 1, except that the composition was coated onto whole surface of a copper through-hole printed circuited board by the method of screen printing and the coated matter was introduced into a hot air circulation type oven and dried at 80° C. for 20 minutes.

Comparative Example 8

| | |
|---|---:|
| The resin obtained in Production Example 1 (unsaturated resin) | 45.0 parts |
| Diallyl phthalate prepolymer (manufd. by Osaka Soda Co.) | 5.0 parts |
| Cellosolve acetate | 5.0 parts |
| Trimethylolpropane triacrylate | 4.0 parts |
| Triethyleneglycol diacrylate | 3.0 parts |
| 2-Methyl-1-[4-(methylthio)phenyl]-2-morpholinopropan-1-one | 3.0 parts |
| 2,4-Diisopropylthioxanthone | 2.5 parts |
| Clay | 11.0 parts |
| Finely powdered talc | 5.0 parts |
| Phthalocyanine Green | 0.5 part |
| Flowlen AC-300 (manufd. by Kyoueisha Yushi Co.) | 1.0 part |
| YX-4000 (manufd. by Yuka Shell Co.) | 12.0 parts |
| Dicyandiamide | 2.0 parts |
| 2E4NZ-CNS (curing agent manufd. by Shikoku Kasei Kogyo Co.) | 1.0 part |
| Total | 100.0 parts |

A photosensitive thermosetting resin composition was prepared by repeating the procedure of Example 1, except that the ingredients to be compounded were altered to those mentioned above. Particle size of the composition thus obtained was 25 μm or less. A solder resist pattern was formed by repeating the procedure of Example 1, except that the photosensitive thermosetting resin composition obtained herein was coated onto whole surface of a copper through-hole printed circuit board by the method of screen printing.

Comparative Example 9

| | |
|---|---:|
| The resin obtained in Production Example 6 (photosensitive prepolymer) | 30.0 parts |
| Butyl cellosolve | 11.5 parts |
| Pentaerythritol tetraacrylate | 5.0 parts |
| Hydroxycyclohexyl phenyl ketone | 3.0 parts |
| N,N-Dimethylaminoacetophenone | 1.0 part |
| Barium sulfate | 10.0 parts |
| Finely powdered talc | 4.0 parts |
| Phthalocyanine Green | 0.5 part |
| Flowlen AC-300 (manufd. by Kyoueisha Yushi Co.) | 1.0 part |
| EPX-30 (manufd. by Asahi Denka Kogyo) | 15.0 parts |
| 2PHZJ | 1.0 part |
| Total | 82.0 parts |

A photosensitive thermosetting resin composition was prepared by repeating the procedure of Example 1, except that the ingredients to be compounded were altered to those mentioned above. Particle size of the composition thus obtained was 25 μm or less. A solder resist pattern was formed by repeating the procedure of Example 1, except that the photosensitive thermosetting resin composition obtained herein was coated onto whole surface of a copper through-hole printed circuit board by the method of screen printing.

Comparative Example 10

| | |
|---|---:|
| The resin obtained in Production Example 7 (photosensitive prepolymer) | 35.0 parts |
| Carbitol acetate | 10.0 parts |
| Dipentaerythritol hexaacrylate | 3.0 parts |
| Diethyleneglycol diacrylate | 3.0 parts |
| Benzil dimethyl ketal | 3.0 parts |
| N,N-Dimethylaminoacetophenone | 1.5 part |

-continued

| | |
|---|---|
| Barium sulfate | 10.0 parts |
| Amorphous silica | 15.0 parts |
| Phthalocyanine Green | 0.5 part |
| Flowlen AC-300 (manufd. by Kyoueisha Yushi Co.) | 1.5 part |
| Araldite PT810 (manufd. by Ciba Geigy) | 15.0 parts |
| Dicyandiamide | 2.0 parts |
| 2P4MHZ | 0.5 part |
| (curing agent manufd. by Shikoku Kasei Kogyo Co.) | |
| Total | 100.0 parts |

A light exposure type thermosetting resin composition was prepared by repeating the procedure of Example 1, except that the ingredients to be compounded were altered to those mentioned above. Particle size of the composition thus obtained was 20 μm or less. Using the light exposure type thermosetting resin composition obtained herein, a solder resist pattern was formed by repeating the procedure of Example 1.

Comparative Example 12

| | |
|---|---|
| The resin obtained in Production Example 1 (unsaturated resin) | 30.0 parts |
| The resin obtained in Production Example 6 (photosensitive prepolymer) | 10.0 parts |
| Dipentaerythritol hexaacrylate | 13.0 parts |
| Trimethylolpropane acrylate | 4.0 parts |
| Irgacure 369 (manufd. by Ciba Geigy) | 3.0 parts |
| Isopropylthioxanthone | 1.0 part |
| Barium sulfate | 17.5 parts |
| Finely powdered talc | 3.0 parts |
| Aerosil #200 (manufd. by Japan Aerosil) | 1.0 part |
| Phthalocyanine green | 0.5 part |
| Flowlen AC-300 (manufd. by Kyoueisha Yushi Co.) | 1.0 part |
| Dicyandiamide | 1.0 part |
| YX-4000 (manufd. by Yuka Shell Co.) | 15.0 parts |
| Total | 100.0 parts |

A light exposure type thermosetting resin composition was prepared by repeating the procedure of Example 1, except that the ingredients to be compounded were altered to those mentioned above. Particle size of the composition thus obtained was 20 μm or less. Using the light exposure type thermosetting resin composition obtained herein, a solder resist pattern was formed by repeating the procedure of Example 1.

The solder resist resin compositions obtained in Examples 1–10 and Comparative Examples 1–12 were examined on characteristic properties. The results are shown in Table 1 and Table 2.

Each of the photosensitive solder resists prepared in Examples 1–10 and Comparative Examples 1–12 was coated up to a coating thickness of 30–40 μm by the method of screen printing on the whole surface of a surface-treated and patterned copper-clad laminate board. Then, the coated laminate board was dried for 20 minutes in a hot air circulation type drying oven kept at 80° C. After intimately contacting a negative film of desired pattern with the resist, the resist was exposed to an ultraviolet ray having an intensity of 25 mW/cm$^2$ at a wavelength of 365 nm for a period of 10 seconds, until the integrated dose of the ultraviolet irradiation reached 150 mJ/cm$^2$ as measured with integrating photometer manufactured by Orc Seisakusho Co., provided that Comparative Samples 9–11 were made into test pieces by irradiating them at a dose of 750 mJ/cm$^2$, because characteristic properties of these comparative samples could not be measured when made into test pieces on the same dose level as above. After development for 60 seconds using a 1% by weight aqueous solution of sodium carbonate (in some experiments, 1% KOH solution or cyclohexanone was used as the developer), the developed test pieces were heat-cured in a hot air circulation type oven kept at 150° C. for 60 minutes. On the samples thus obtained, dryness to the touch after the drying treatment, photosensitivity, developability (the state of coating film after development), adhesiveness, hardness of coating film, acid resistance, alkali resistance, solvent resistance, plating resistance, solder resistance, K-183 flux resistance, insulation resistance, insulation resistance in a humidified atmosphere, resolution property, water absorption rate, sensitivity, odor after exposure to light, boiling adhesiveness, re-heating adhesiveness, standing developability and time-dependent change were tested and evaluated.

Various properties in the following Tables 1 and 2 were tested, evaluated and judged as described below.

1) Dry Tackiness

After the composition was coated on a copper through etching circuit substrate by screen printing, the substrate was placed in a hot air-circulating type drying furnace, and the composition was dried at 80° C. for 20 minutes. Then, the coating surface was pushed strongly with fingers to examine a sticking degree, whereby the state of the coating film was judged.

⊙: Neither sticking nor fingerprint mark is observed.

○: Slight sticking and fingerprint marks are observed on the surface.

Δ: Remarkable sticking and fingerprint marks are observed on the surface.

X: The surface is absolutely sticky.

2) Photosensitivity Test

The states of the coating films after UV rays having a wavelength of 365 nm were irradiated in exposed doses of 50 mJ/cm$^2$, 100 mJ/cm$^2$ and 150 mJ/cm$^2$ by using the integrating photometer produced by Orc Seisakusho Co. and development was carried out with a developing solution for 60 seconds at a spray pressure of 2 kg/cm$^2$, respectively, were judged visually.

⊙: No change is observed.

○: The surface is slightly changed.

Δ: The surface is remarkably changed.

X: The coating is fallen.

3) Developability Test

Test pieces were obtained by irradiating UV rays having a wavelength of 365 nm in an exposed dose of 150 mJ/cm$^2$ by using the integrating photometer produced by Orc Seisakusho Co. through a photomask, respectively. As comparative samples, test pieces irradiated in a dose of 750 mJ/cm$^2$ were used. The states of removing unexposed portions after development was carried out with a developing solution for 20 seconds, 40 seconds and 60 seconds at a spray pressure of 2 kg/cm$^2$, respectively, were judged visually.

⊙: The test piece is completely developed.

○: There is a thin undeveloped portion on the surface.

Δ: There are undeveloped portions entirely on the surface.

X: The test piece is almost not developed.

4) Adhesion Property Test

Test pieces were obtained by irradiating UV rays having a wavelength of 365 nm in an exposed dose of 150 mJ/cm$^2$ by using the integrating photometer produced by Orc Seisakusho Co. through a photomask, respectively. As comparative samples, test pieces irradiated in a dose of 750 mJ/cm² were used. Test pieces were obtained by carrying out development with the respective developing solutions for 60 seconds at a spray pressure of 2 kg/cm² and then postcuring under the respective conditions. According to the test method of JIS D0202, checkered cross cuts were made, and the states of peeling after a peeling test using an adhesive tape were judged visually.
(⊙): 100/100, no peeling is observed.
○: 100/100, the cross cut portions are slightly peeled off.
Δ: 50/100 to 90/100
X: 0/100 to 50/100

5) Pencil Hardness Test

The hardnesses of the same test pieces as in the adhesion property test (4) were measured with a load of 1 kg according to the test method of JIS K5400, respectively.

6) Acid Resistance Test

The same test pieces as in the adhesion property test (4) were dipped in a 10% by volume aqueous sulfuric acid solution at 20° C. for 30 minutes and then taken out, respectively. The states and adhesion properties of the coating films were judged and evaluated synthetically.
(⊙): No change is observed.
○: Slight change is observed.
Δ: Remarkable change is observed.
X: Blistering or swelling and falling of the coating film is/are observed.

7) Alkali Resistance Test

A test and evaluation were carried out in the same manner as in the acid resistance test (6) except that the 10% by weight aqueous sulfuric acid solution was replaced by a 10% by weight aqueous sodium hydroxide solution.

8) Solvent Resistance Test

A test and evaluation were carried out in the same manner as in the acid resistance test (6) except that the 10% by volume aqueous sulfuric acid solution was replaced by acetone.

9) Plating Resistance Test

The states of the coating films after the same test pieces as in the adhesion property test (4) were plated by using "Autronex Cl" (a plating solution produced by Cellulex$^{(sic)}$ Co. in U.S.A.) at a liquid temperature of 30° C. and a current density of 1 A/dm² for 9 minutes to precipitate gold with a thickness of 1.5 μm, respectively, were evaluated in the same manner as in the acid resistance test.

10) Soldering Resistance Test

The states of the coating films after the same test pieces as in the adhesion property test (4) were dipped in a soldering bath at 26° C. for 10 seconds once and three times according to the test method of JIS C6481, respectively, were evaluated in the same manner as in the acid resistance test.

11) Strength Resistance Test

The states of the coating films after the same test pieces as in the adhesion property test (4) were dipped in a soldering bath at 260° C. for 10 seconds once and three times according to the test method of JIS C6481, respectively, were evaluated in the same manner as in the acid resistance test. As a flux to be used, K-183 (produced by Alpha-Metal Co.) was coated, and the same test was carried out.

12) Measurement of Insulation Resistance

Using a comb-form test pattern B of IPC-B-25, test pieces were prepared under the same conditions as in the Adhesion Property Test (4). According to the testing method of IPC-SH-840B, the insulating resistance in the ordinary state and the insulation resistance under the following conditions were measured: temperature cycle 25–65° C., relative humidity 90%, input direct current voltage 100V, period 7 days.

13) Measurement of Insulating Resistance in Humidified Atmosphere

Using a comb-form test pattern B of IPC-B-25, test pieces were prepared under the same conditions as in the Adhesion Property Test (4). Insulation resistance was measured in a chamber at a relative temperature of 85° C., a relative humidity of 92% and an input direct current voltage of 50V.

14) Measurement of Resolution Property

Test pieces were prepared by irradiating a sample of the present invention with an ultraviolet ray having a wavelength of 365 nm at an integrated dose of 150 mJ/cm² as measured with an integrating photometer manufactured by Orc Seisakusho Co., through artworks of which line/space ratio ranged from 25 μm to 300 μm. On the other hand, control test pieces were prepared by irradiating comparative samples at a dose of 750 mi/cm². After developing the irradiated test pieces with developing solutions for 60 seconds at a spray pressure of 2 kg/cm², the states of the lines remaining unerased after the development and the spaces formed by erasion of lines were visually examined in the exposed area.

15) Measurement of Water Absorption

Test pieces were prepared by irradiating a sample of the present invention with an ultraviolet ray having a wavelength of 365 nm at an integrated dose of 150 mJ/cm² as measured with an integrating photometer manufactured by Orc Seisakusho Co., through an art work (in case of control samples, the dose was 750 mJ/cm²), developing the exposed sample with a developing solution at a spray pressure of 2 kg/cm² for 60 seconds, and then post-curing the developed sample at 150° C. for 60 minutes. Ceramic board was used as the substrate in place of glass epoxy substrate (FR-4), because test pieces prepared from FR-4 gave much dispersed results. Test pieces were prepared under the same conditions as in the Adhesion Property Test (4) and allowed to stand in an atmosphere having a temperature of 85° C. and a relative humidity of 90% for 120 hours, after which the change in water absorption was measured.

16) Measurement of Sensitivity

A sample was irradiated with an ultraviolet ray having a wavelength of 365 nm at an integrated dose of 150 mJ/cm² as measured with an integrating photometer manufactured by Orc Seisakusho Co., and developed in a developing solution for 60 seconds under a spray pressure of 2 kg/cm², after which the state of coating film was visually examined. As the artwork, a step tablet manufactured by Stouffer Co. was used.

17) Measurement of Odor

Test pieces were prepared by irradiating samples of the present invention with an ultraviolet ray having a wavelength of 365 nm through an artwork at an integrated dose of 150 nm/cm² as measured with an integrating photometer manufactured by Orc Seisakusho Co., provided that in case of control test pieces, the dose was 750 mJ/cm². After exposure to light, the film was stripped off, and whether or not an odor was noticed at this time was checked. Further, after a post-cure at 150° C. for 60 minutes in an oven, the oven was opened, and whether or not an odor was noticed at this time was also checked.

18) Boiling Adhesiveness Test

The same test piece as used in the Adhesion Property test (4) was dipped in boiling water at 100° C. in a glass beaker for one hour, after which the test piece was withdrawn. Then, checkers were cut on the test piece according to JIS 0202, a peeling test was carried out by the use of a cellophane tape, and the state of peeling was examined visually.

ⓞ: 100/100, no peeling at all
o: 100/100, slight peeling in cross-cut parts
Δ: 50/100–90/100
X: 0/100–50/100

19) Re-heating Adhesiveness Test

The same test piece as used in the Adhesion Property Test (4) was additionally cured at 150° C. for 3 hours, after which checkers were cut according to JIS 0202, peeling test was carried out by the use of cellophane tape, and the state of peeling was visually examined.

ⓞ: 100/100, no peeling at all
o: 100/100, slight peeling in cross-cut parts
Δ: 50/100–90/100
X: 0/100–50/100

20) Standing Developability Test

A test piece was prepared by subjecting a sample to a preliminary drying at 80° C. for 40 minutes, allowing the dried sample to stand under a yellow lamp in a thermostatted chamber kept at 23° C. for 72 hours, and then irradiating the sample through an artwork with an ultraviolet ray having a wavelength of 365 nm at an integrated dose of 150 mJ/cm$^2$ as measured with an integrating photometer manufactured by Orc Seisakusho Co., provided that Comparative Samples 9–11 were irradiated at a dose of 750 mJ/cm$^2$ to make test pieces. The test pieces were developed with developing solutions for 60 seconds at a spray pressure of 2 kg/cm$^2$, after which the state of elimination of the unexposed area was visually examined.

ⓞ: Completely developed
o: A thin undeveloped film left on surface
Δ: Undeveloped matter left on the whole
X: Scarcely developed 21) Time-dependent Change A resist having passed one month after preparation of ink was used. Test pieces were prepared by irradiating the resist samples through an artwork with an ultraviolet ray having a wavelength of 365 nm at an integrated dose of 150 mJ/cm$^2$ as measured with an integrating photometer manufactured by Orc Seisakusho Co., provided that Comparative samples 9–11 were irradiated at a dose of 750 mJ/cm$^2$ to make test pieces. After development with a developing solution for 60 seconds at a spray pressure of 2 kg/cm$^2$, the state of elimination of the unexposed area was visually examined.

ⓞ: Completely developed
o: A thin undeveloped film left on surface
Δ: Undeveloped matter left on the whole
X: Scarcely developed On the samples thus obtained, dryness to the touch, photosensitivity, developability (state of coating film after development), adhesiveness after final cure, hardness of coating film, acid resistance, alkali resistance, solvent resistance, plating resistance, solder resistance, K183 flux resistance, insulation resistance, insulation resistance in humidified atmosphere, resolution property, water absorption rate, sensitivity, odor after exposure to light, boiling adhesiveness, re-heating adhesiveness and standing develop-ability were evaluated. The results are summarized in Table 1 and Table 2. Comparative Samples 9–11 were exposed at a dose of 750 mJ/cm$^2$, because the resist surface of these samples underwent a change and properties thereof could not be compared when the dose was 150 mJ/cm$^2$.

TABLE 1

| Performance | Example 1 | 2 | 3 | 4 | 5 | 6 | 7 | 8 | 9 | 10 |
|---|---|---|---|---|---|---|---|---|---|---|
| Dryness to touch | ⓞ | o | ⓞ | ⓞ | ⓞ | ⓞ | ⓞ | ⓞ | Δ | ⓞ |
| Photosensitivity | | | | | | | | | | |
| 50 mJ/cm$^2$ | o | Δ | Δ | o | Δ | Δ | Δ | o | o | Δ |
| 100 mJ/cm$^2$ | o | o | o | o | o | o | o | o | ⓞ | o |
| 150 mJ/cm$^2$ | ⓞ | ⓞ | ⓞ | ⓞ | ⓞ | ⓞ | ⓞ | ⓞ | o | ⓞ |
| Developability | | | | | | | | | | |
| 30 seconds | ⓞ | ⓞ | Δ | ⓞ | o | o | o | ⓞ | ⓞ | Δ |
| 60 seconds | ⓞ | ⓞ | o | ⓞ | ⓞ | ⓞ | ⓞ | ⓞ | ⓞ | o |
| 90 seconds | ⓞ | ⓞ | ⓞ | ⓞ | ⓞ | ⓞ | ⓞ | ⓞ | ⓞ | ⓞ |
| Adhesiveness | ⓞ | ⓞ | ⓞ | ⓞ | ⓞ | ⓞ | ⓞ | ⓞ | ⓞ | ⓞ |
| Pencil hardness | 6H | 6H | 6H | 6H | 6H | 6H | 6H | 6H | 6H | 6H |
| Acid resistance | ⓞ | o | o | ⓞ | ⓞ | ⓞ | ⓞ | ⓞ | o | o |
| Alkali resistance | ⓞ | o | o | ⓞ | ⓞ | ⓞ | ⓞ | ⓞ | o | o |
| Solvent resistance | ⓞ | ⓞ | ⓞ | ⓞ | ⓞ | ⓞ | ⓞ | ⓞ | ⓞ | ⓞ |
| Plating resistance | ⓞ | o | ⓞ | ⓞ | ⓞ | ⓞ | ⓞ | ⓞ | o | ⓞ |
| Solder resistance | ⓞ | o | o | ⓞ | ⓞ | ⓞ | ⓞ | ⓞ | o | o |
| K183 flux resistance | ⓞ | ⓞ | o | ⓞ | ⓞ | ⓞ | ⓞ | ⓞ | ⓞ | o |
| Insulation resistance (Ω) | 7E6 | 5E5 | 4E6 | 8E6 | 8E6 | 4E6 | 8E6 | 8E6 | 6E5 | 4E6 |
| Resistance in humidified atmosphere (Ω) | 8E3 | 9E6 | 7E3 | 8E3 | 8E3 | 8E3 | 8E3 | 8E3 | 8E2 | 7E3 |
| Resolution (μm) | 25 | 50 | 50 | 25 | 25 | 25 | 25 | 25 | 50 | 50 |
| Water absorption (%) | 0.08 | 0.09 | 0.20 | 0.08 | 0.09 | 0.18 | 0.08 | 0.08 | 0.09 | 0.18 |
| Sensitivity (steps) | 10 | 9 | 9 | 11 | 10 | 9 | 9 | 11 | 10 | 9 |
| Odor after exposure | ⓞ | ⓞ | ⓞ | ⓞ | ⓞ | ⓞ | ⓞ | ⓞ | ⓞ | ⓞ |
| Boiling adhesiveness | ⓞ | ⓞ | o | ⓞ | ⓞ | ⓞ | ⓞ | ⓞ | ⓞ | o |
| Re-heating adhesiveness | ⓞ | ⓞ | ⓞ | ⓞ | ⓞ | ⓞ | ⓞ | ⓞ | ⓞ | ⓞ |

TABLE 1-continued

|  | Example |  |  |  |  |  |  |  |  |  |
|---|---|---|---|---|---|---|---|---|---|---|
| Performance | 1 | 2 | 3 | 4 | 5 | 6 | 7 | 8 | 9 | 10 |
| Standing developability | ⊚ | ○ | ○ | ⊚ | ⊚ | ⊚ | ⊚ | ⊚ | ○ | ○ |
| Time-dependent change | ⊚ | ⊚ | ⊚ | ⊚ | ⊚ | ⊚ | ⊚ | ⊚ | ⊚ | ⊚ |

TABLE 2

|  | Comparative Example |  |  |  |  |  |  |  |  |  |  |  |
|---|---|---|---|---|---|---|---|---|---|---|---|---|
| Performance | 1 | 2 | 3 | 4 | 5 | 6 | 7 | 8 | 9 | 10 | 11 | 12 |
| Dryness to touch | ⊚ | ⊚ | ⊚ | ○ | ○ | ⊚ | ⊚ | ⊚ | ○ | ○ | △ | ⊚ |
| Photosensitivity |  |  |  |  |  |  |  |  |  |  |  |  |
| 50 mJ/cm² | ○ | ○ | ○ | △ | △ | △ | ○ | △ | X | X | X | ○ |
| 100 mJ/cm² | ⊚ | ⊚ | ○ | ○ | ○ | ○ | ⊚ | ○ | X | X | X | ○ |
| 150 mJ/cm² | ⊚ | ⊚ | ⊚ | ⊚ | ⊚ | ⊚ | ⊚ | ⊚ | △ | X | X | ⊚ |
| Developability |  |  |  |  |  |  |  |  |  |  |  |  |
| 30 seconds | ⊚ | ⊚ | ○ | ○ | △ | △ | ⊚ | △ | △ | X | △ | ⊚ |
| 60 seconds | ⊚ | ⊚ | ⊚ | ⊚ | ○ | ⊚ | ⊚ | ⊚ | ⊚ | ○ | ⊚ | ⊚ |
| 90 seconds | ⊚ | ⊚ | ⊚ | ⊚ | ⊚ | ⊚ | ⊚ | ⊚ | ⊚ | ⊚ | ⊚ | ⊚ |
| Adhesiveness | ⊚ | △ | ⊚ | ⊚ | ⊚ | ⊚ | ⊚ | ⊚ | ⊚ | ⊚ | ⊚ | △ |
| Pencil hardness | 6H | 6H | 6H | 6H | 6H | 6H | 6H | 6H | 6H | 6H | 7H | 6H |
| Acid resistance | ⊚ | △ | ⊚ | ⊚ | ⊚ | ⊚ | ⊚ | ⊚ | △ | △ | X | △ |
| Alkali resistance | ⊚ | △ | ⊚ | ⊚ | ⊚ | ⊚ | ⊚ | ⊚ | ○ | △ | △ | △ |
| Solvent resistance | ⊚ | ⊚ | ⊚ | ⊚ | ⊚ | ⊚ | ⊚ | ⊚ | △ | ○ | ○ | ⊚ |
| Plating resistance | ⊚ | △ | ⊚ | ⊚ | ⊚ | ⊚ | ⊚ | ⊚ | ○ | △ | X | △ |
| Solder resistance | ⊚ | ○ | ⊚ | ⊚ | ⊚ | ⊚ | ⊚ | ⊚ | ○ | ○ | ⊚ | ○ |
| K183 flux resistance | ⊚ | ○ | ⊚ | ⊚ | ⊚ | ⊚ | ⊚ | ⊚ | X | X | X | ○ |
| Insulation resistance (Ω) | 3E7 | 3E7 | 8E6 | 6E5 | 5E7 | 6E7 | 4E7 | 6E7 | 3E6 | 5E5 | 4E4 | 7E6 |
| Resistance in humidified atmosphere (Ω) | 9E3 | 9E3 | 8E3 | 9E2 | 8E3 | 5E3 | 9E3 | 5E3 | 4E2 | 5E1 | 2E1 | 8E3 |
| Resolution (μm) | 25 | 25 | 75 | 50 | 75 | 100 | 25 | 100 | 100 | 150 | 200 | 25 |
| Water absorption (%) | 0.05 | 0.06 | 0.05 | 0.10 | 0.10 | 0.07 | 0.05 | 0.08 | 0.5 | 1.0 | 2.0 | 0.08 |
| Sensitivity (steps) | 10 | 10 | 10 | 9 | 9 | 8 | 11 | 8 | 5 | 3 | 3 | 10 |
| Odor after exposure | ⊚ | ⊚ | ⊚ | ⊚ | ⊚ | ⊚ | ⊚ | X | X | ○ | X | ⊚ |
| Boiling adhesiveness | X | X | X | X | X | X | X | X | X | X | X | X |
| Re-heating adhesiveness | X | X | X | X | X | X | X | X | △ | △ | △ | X |
| Standing developability | X | X | X | X | X | X | X | X | ○ | △ | X | ⊚ |
| Time-dependent change | X | X | X | X | X | X | X | X | ○ | ○ | ○ | ⊚ |

In the above Tables 1 and 2, E1 to 7 of insulation resistance and resistance under humidification each represent a multiplier portion of a resistance value. That is, E1, E2, E3, E4, E5, E6 and E7 represent ×10⁷, ×10⁸, ×10⁹, ×10¹⁰, ×10¹¹, ×10¹² and ×10¹³, respectively. For example, 2E3 represents 2×10⁹ Ω. Odor after exposure means that odor is generated when a film is peeled off after exposure.

The photopolymerizable thermosetting resin composition of the present invention is outstandingly excellent in the general properties required of a solder resist, such as coating characteristics, drying characteristics, tackiness, photosetting property, developability, thermosetting property, pot life, shelf life, solder resistance, solvent resistance, chemical resistance, adhesion property, electrical insulating property, resistance to electrolytic corrosion, electrical properties in humidified atmosphere, plating resistance, boiling adhesiveness, re-heating adhesiveness, standing developability, adhesive property to rustproofed substrate, etc. Further, the composition of the present invention can be developed with dilute alkali solutions and weakly alkaline solutions and is odorless, so that the composition of the invention is excellent from the viewpoint of environmental protection.

What is claimed is:

1. A photopolymerizable thermosetting resin composition comprising:
 (A) a mixture of an active energy ray-setting resin (a) and a photosensitive prepolymer (b) having an acid value of 40–160 mg KOH/g,
 (B) a diluent,
 (C) a photopolymerization initiator,
 (D) a setting adhesion-imparting agent, and
 (E) an epoxy group containing compound, wherein said active energy ray-setting resin (a) is selected from the group consisting of (i) an unsaturated resin (a-1) obtained by reacting an unsaturated monobasic acid copolymer resin with a cycloaliphatic epoxy group-containing unsaturated compound and (ii) an unsaturated resin (a-2) obtained by reacting a cycloaliphatic epoxy group-containing copolymer resin with an acid group-containing unsaturated compound;

said photosensitive prepolymer (b) is selected from the group consisting of (i) a prepolymer (b-1) obtained by esterifying an novolak epoxy compound with an $\alpha,\beta$-unsaturated carboxylic acid to form a total epoxy groups-esterified product, followed by reacting the total epoxy groups-esterified product thus obtained with a saturated or unsaturated polybasic acid anhydride, (ii) a prepolymer (b-2) obtained by esterifying a novolak epoxy compound with an $\alpha,\beta$-unsaturated carboxylic acid to form a partial epoxy groups-esterified product, followed by reacting the partial epoxy groups-esterified product thus obtained with a saturated or unsaturated polybasic acid anhydride, and (iii) a prepolymer (b-3) obtained by reacting a diisocyanate with a (meth) acrylate having one hydroxyl group in one molecule to obtain a first reaction product, followed by reacting said first reaction product with the secondary hydroxy groups of a total epoxy groups-esterified product obtained by esterifying an novolak epoxy compound with an $\alpha,\beta$-unsaturated carboxylic acid to obtain a second reaction product, and then reacting said second reaction product with a saturated or unsaturated polybasic acid anhydride;

and the ingredients (a) and (b) are compounded at a compounding ratio of 5–100 parts by weight of (b) per 100 parts by weight of (a).

2. A photopolymerizable thermosetting resin composition according to claim 1 which comprises 30–70 parts by weight of ingredient (A), 5–50 parts by weight of ingredient (B), 3–20 parts by weight of ingredient (C), 0.1–7 parts by weight of ingredient (D) and 5–50 parts by weight of ingredient (E).

3. A photopolymerizable thermosetting resin composition according to claim 1, wherein an active energy ray-setting resin (a) having an acid value of 40–250 mg KOH/g is compounded with a photosensitive prepolymer (b) having an acid value of 40–160 mg KOH/g.

4. A photopolymerizable thermosetting resin composition according to claim 1, wherein said diluent (B) is at least one photopolymerizable vinyl monomer selected from the group consisting of hydroxyalkyl (meth)acrylates, mono- and di-(meth)acrylates of glycols, acrylamido acid, aminoalkyl (meth)acrylates, poly(meth)acrylates of polyhydric alcohols, poly(meth)acrylates of polyhydric alcohol-ethylene oxide adducts, poly(meth)acrylates of polyhydric alcohol-propylene oxide adducts, (meth)acrylates of phenols, (meth)acrylates of phenol-ethylene oxide adducts, (meth)acrylates of phenol-propylene oxide adducts, (meth) acrylates of glycidyl ethers, and melamine (meth)acrylate.

5. A photopolymerizable thermosetting resin composition according to claim 1, wherein said diluent (B) is at least one organic solvent selected from the group consisting of ketones, aromatic hydrocarbons, glycol ethers, esters, alcohols, aliphatic hydrocarbons and petroleum solvents.

6. A photopolymerizable thermosetting resin composition according to claim 1, wherein the amount of said diluent (B) is 20 to 300 parts by weight per 100 parts by weight of said mixture (A) consisting of active energy ray-setting resin (a) and photosensitive prepolymer (b).

7. A photopolymerizable thermosetting resin composition according to claim 1, wherein the amount of said photopolymerization initiator (C) is 0.2 to 30 parts by weight per 100 parts by weight of said mixture (A) consisting of active energy ray-setting resin (a) and photosensitive prepolymer (b).

8. A photopolymerizable thermosetting resin composition according to claim 1, wherein said epoxy compound (E) is at least one epoxy resin selected from the group consisting of a Bisphenol S epoxy resin, diglycidyl phthalate resin, heterocyclic epoxy resin, bixylenol epoxy resin, bisphenol epoxy resin, tetraglycidyl xylenoyl epoxy resin, Bisphenol A epoxy resin, hydrogenated Bisphenol A epoxy resin, Bisphenol F epoxy resin, brominated Bisphenol A epoxy resin, novolak epoxy resin, Bisphenol A novolak epoxy resin, chelate epoxy resin, glyoxal epoxy resin, amino group-containing epoxy resin, rubber-modified epoxy resin, dicyclopentadiene phenolic epoxy resin, silicone-modified epoxy resin, and $\epsilon$-caprolactone-modified epoxy resin.

9. A photopolymerizable thermosetting resin composition according to claim 1, wherein the compounding ratio of the epoxy compound (E) to the mixture (A) consisting of active energy ray-setting resin (a) and photosensitive prepolymer (b) is 50 to 95:50 to 5 by weight.

10. A photopolymerizable thermosetting resin composition according to claim 1 which contains an inorganic filler.

11. A photopolymerizable thermosetting resin composition according to claim 1 which contains at least one additive selected from the group consisting of colorant, thermal polymerization inhibitor, thickener, antifoaming agent and leveling agent.

12. A process for forming a solder resist pattern which comprises coating a printed circuit board with the photopolymerizable thermosetting resin composition according to claim 1, preliminarily drying the coated printed circuit board, selectively exposing the coated printed circuit board to an active energy ray through a photomask to effect a photopolymerization, developing the unexposed area with a developing liquid to form a resist pattern, and then thermosetting the resist pattern by heating.

13. A method for forming a solder resist pattern according to claim 12, which comprises coating a printed circuit board with a photopolymerizable thermosetting resin composition by the method of screen printing, curtain coating, roll coating or spray coating.

14. A method for forming a solder resist pattern according to claim 12, wherein said developing liquid is at least one member selected from the group consisting of cyclohexanone, xylene, tetramethylbenzene, butyl cellosolve, butyl carbitol, propylene glycol monomethyl ether, cellosolve acetate, propanol, propylene glycol, trichlorethane, trichloroethylene, aqueous solution of potassium hydroxide, aqueous solution of sodium hydroxide, aqueous solution of sodium carbonate, aqueous solution of potassium carbonate, aqueous solution of sodium phosphate, aqueous solution of sodium silicate, aqueous solution of ammonia and aqueous solution of an amine.

* * * * *